United States Patent
Al-Ali et al.

(10) Patent No.: US 6,584,204 B1
(45) Date of Patent: Jun. 24, 2003

(54) LOUDSPEAKER SYSTEM WITH FEEDBACK CONTROL FOR IMPROVED BANDWIDTH AND DISTORTION REDUCTION

(75) Inventors: Khalid M. Al-Ali, Hercules, CA (US); Andrew Packard, Berkeley, CA (US); Benson H. Tongue, Walnut Creek, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/209,645

(22) Filed: Dec. 10, 1998

Related U.S. Application Data
(60) Provisional application No. 60/069,223, filed on Dec. 11, 1997.

(51) Int. Cl.[7] ................................................ H04R 3/00
(52) U.S. Cl. ................................... 381/96; 381/94.3
(58) Field of Search .......................... 381/95, 96, 102, 381/104, 107–108, 120, 93, 83, 59, 94.3, 60

(56) References Cited

U.S. PATENT DOCUMENTS

| | | | |
|---|---|---|---|
| 3,009,991 A | * 11/1961 | Bekey | 381/96 |
| 3,941,932 A | 3/1976 | D'Hoogh | 179/1 F |
| 4,165,445 A | 8/1979 | Brosow | |
| 4,180,706 A | 12/1979 | Bakgaard | 179/1 F |
| 4,207,430 A | 6/1980 | Harada et al. | 179/1 F |
| 4,243,838 A | * 1/1981 | Coffey | 179/1 |
| 4,243,839 A | 1/1981 | Takahashi et al. | 179/1 F |
| 4,256,923 A | 3/1981 | Meyers | 179/1 F |
| 4,276,443 A | 6/1981 | Meyers | 179/1 F |
| 4,395,588 A | * 7/1983 | Franssen et al. | 179/1 |
| 4,573,189 A | 2/1986 | Hall | 381/96 |
| 4,727,584 A | 2/1988 | Hall | 381/96 |
| 4,868,870 A | 9/1989 | Schrader | 381/96 |
| 5,086,473 A | * 2/1992 | Erath | 381/96 |
| 5,197,104 A | 3/1993 | Padi | 381/192 |
| 5,461,676 A | * 10/1995 | Hobelsberger | 381/96 |
| 5,481,615 A | 1/1996 | Eatwell et al. | 381/71 |
| 5,484,969 A | * 1/1996 | McKendree et al. | 181/142 |
| 5,506,910 A | 4/1996 | Miller et al. | |
| 5,629,987 A | * 5/1997 | Hobelsberger | 381/96 |
| 5,666,427 A | 9/1997 | Kim et al. | 381/71.1 |
| 5,694,476 A | * 12/1997 | Klippel | 381/96 |
| 5,729,611 A | * 3/1998 | Bonneville | 381/55 |

(List continued on next page.)

FOREIGN PATENT DOCUMENTS

DE        171065 A2 *  8/1985  .................. 381/96

OTHER PUBLICATIONS

"Beyond Singular Values and Loop Shapes"; Gunter Stein & John Doyle and John C. Doyle; American Institute and Astronaut Inc.; Sep. 26, 1988.*

Tutorial Paper—"Beyond Singular Values and Loop Shapes"; Gunter Stein & John C. Doyle; American Institute of Aeronautics and Astronautics, Inc.; Sep. 26, 1988.

"Linear, Multivariable Robust Control With a $\mu$ Perspective"; Andy Packard, John Doyle and Gary Balas; Transactions of the ASME, Jun. 1993, vol. 115, pp 426–438. (Manuscript received by Dynamic Systems, Measurement, and Control Division on Jan. 20, 1993).

*Primary Examiner*—Curtis Kuntz
*Assistant Examiner*—Lun-See Lao
(74) *Attorney, Agent, or Firm*—Pennie & Edmonds LLP

(57) ABSTRACT

A sound producing system includes a loudspeaker to generate an audible signal. A transducer generates a pressure feedback signal from the audible signal. A controller produces a controlled signal for application to the loudspeaker. The controller derives the controlled signal from the pressure feedback signal and an audio input signal. The controlled signal improves the Sound Pressure Level (SPL) frequency response and reduces distortion within a selected bandwidth of the loudspeaker.

30 Claims, 20 Drawing Sheets

U.S. PATENT DOCUMENTS

| | | |
|---|---|---|
| 5,768,398 A | 6/1998 | Janse et al. |
| 5,771,297 A | 6/1998 | Richardson ................... 381/57 |
| 5,848,169 A | * 12/1998 | Clark, Jr. et al. ........ 381/71.13 |
| 5,933,495 A | 8/1999 | Oh |
| 6,031,919 A | 2/2000 | Funahashi et al. |
| 6,072,879 A | 6/2000 | Ouchi et al. |
| 6,088,459 A | 7/2000 | Hobelsberger |
| 6,263,078 B1 | 7/2001 | McLaughlin et al. |
| 6,282,296 B1 | 8/2001 | Konno et al. |

* cited by examiner

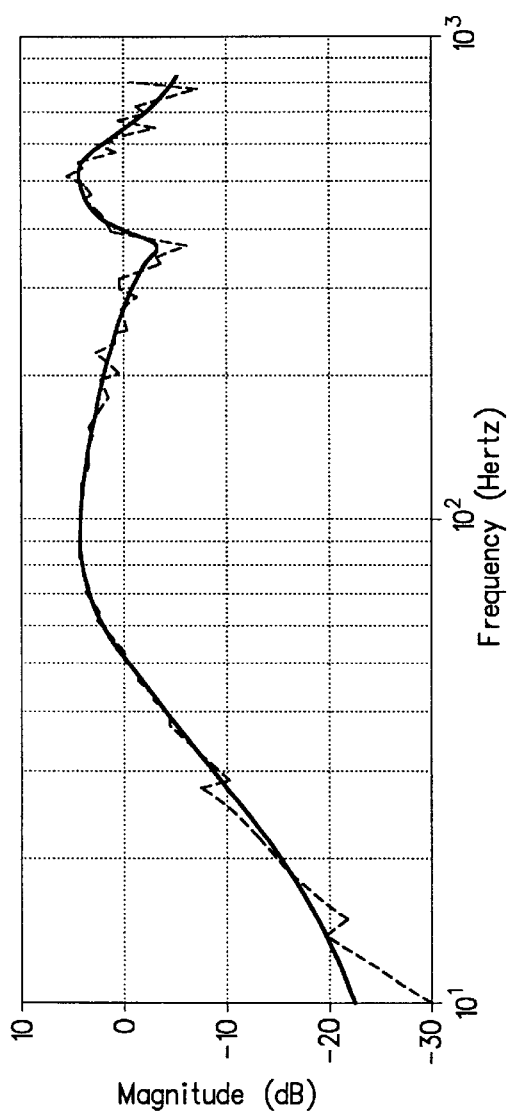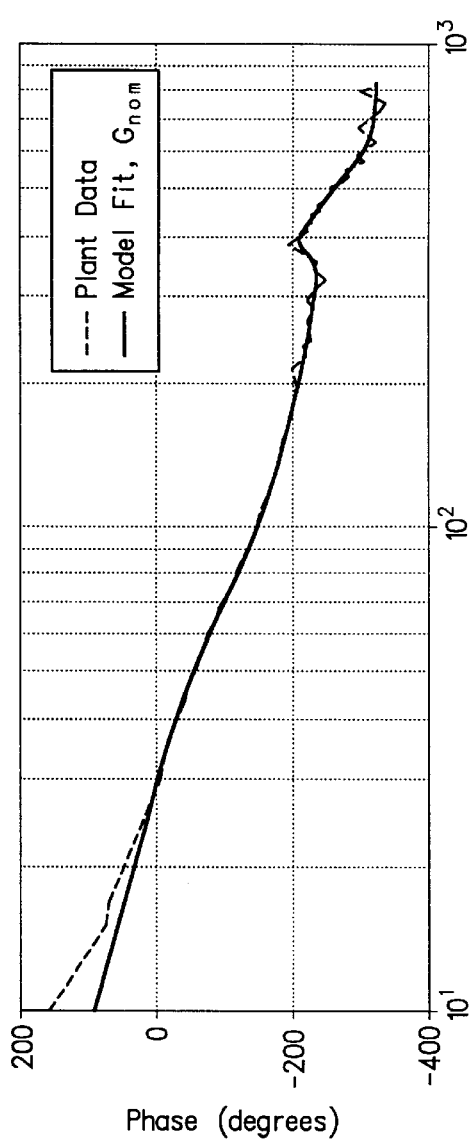

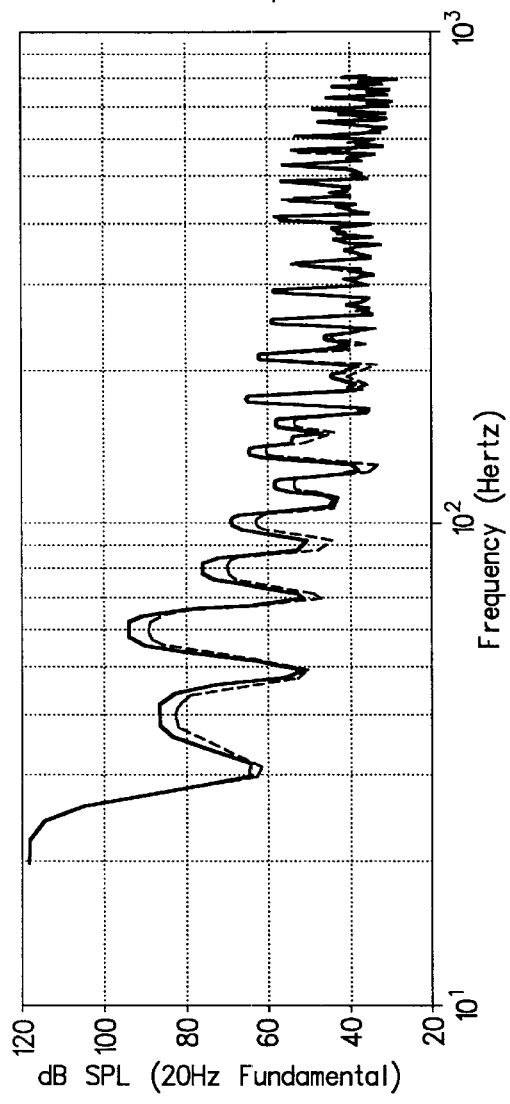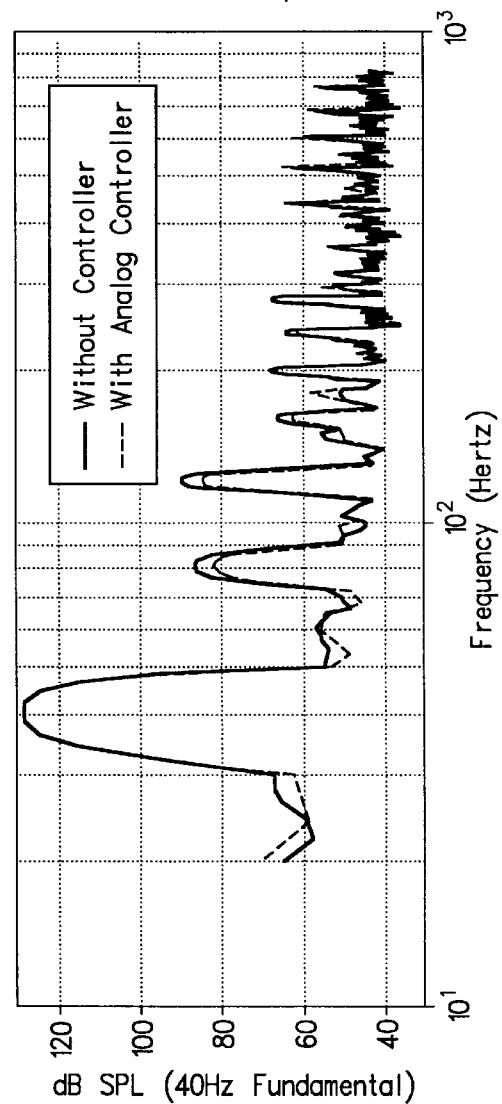

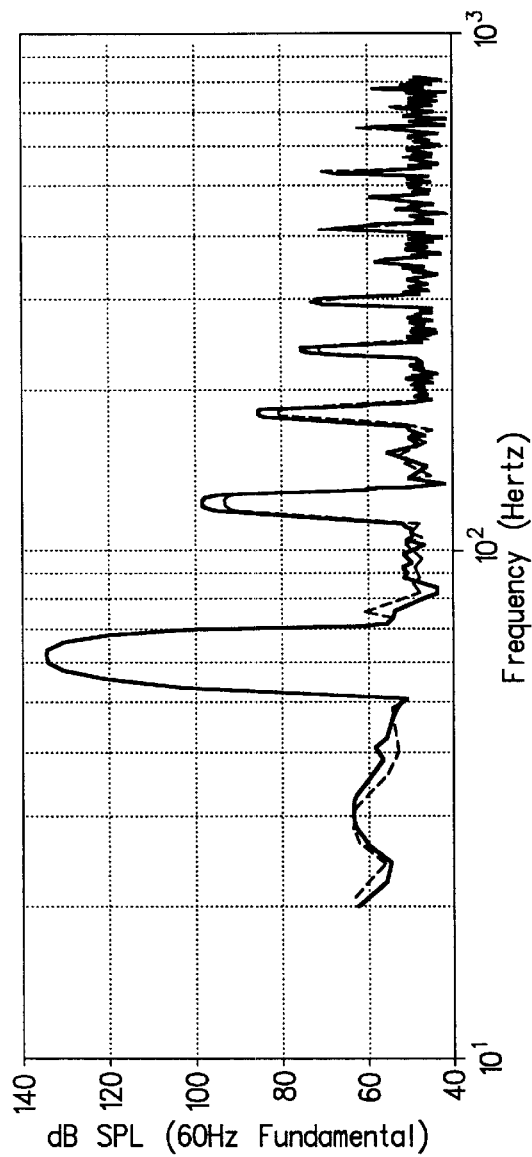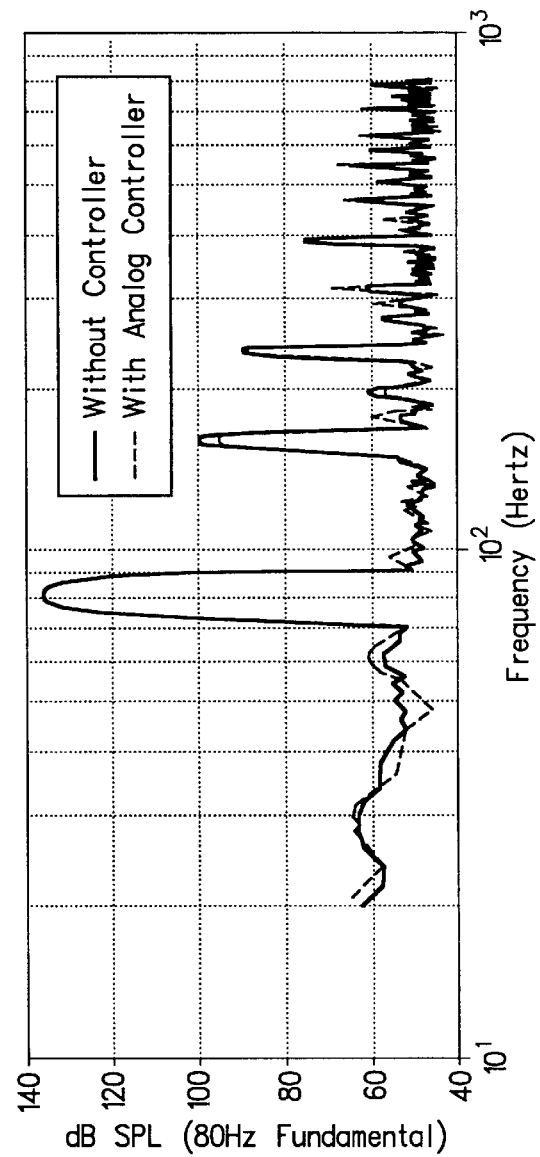

LOUDSPEAKER SYSTEM WITH FEEDBACK CONTROL FOR IMPROVED BANDWIDTH AND DISTORTION REDUCTION

This application claims priority to the provisional patent application entitled, "Bandwidth Improvement & Distortion Reduction in Closed-Box Loudspeaker Systems", Ser. No. 60/069,223, filed Dec. 11, 1997.

This invention was made with Government support under Grant (Contract) No. CTS-9057420, awarded by the National Science Foundation. The U.S. Government has certain rights to this invention.

BRIEF DESCRIPTION OF THE INVENTION

This invention relates generally to audio systems. More particularly, this invention relates to a loudspeaker system that utilizes pressure feedback control to improve bandwidth and reduce distortion.

BACKGROUND OF THE INVENTION

Modem recording techniques and contemporary playback systems (e.g. Compact Disc players) are capable of reproducing signals in the extremes of the audible spectrum (from 20 Hz to 20 kHz). Since the weakest link in a well designed audio system is typically its loudspeaker system, rigid requirements are placed on the loudspeaker's design. An important part of the audio spectrum is the sub-bass frequency region (i.e., between 20 and 100 Hz). The audio industry is endeavoring to achieve a flatter amplitude and phase response and lower distortion in the sub-bass frequency region. Loudspeakers that operate in the sub-bass frequency region are frequently referred to as woofers or subwoofers.

Faithful reproduction of sub-bass signals by conventional subwoofers requires sophisticated electromechanical design techniques, advanced materials, and tight tolerances, necessitating added manufacturing costs. However, even expensive subwoofer systems are limited by the inherent dynamics of low-frequency reproduction and become highly nonlinear well before reaching their maximum acoustic output.

Several manufacturers of audio equipment have built signal processors that merely equalize the signal into the subwoofer in order to flatten the subwoofer's frequency response. Even though some of these companies describe the method as "Servo Control", it isn't. By definition, servo control necessitates feedback signals from a controllable system. While the equalizing method has the advantage of simplicity (a sensor is not necessary), it cannot compensate for variations in the subwoofer's behavior (e.g. aging, effects of the environment on the subwoofer due to changes in acoustic venues, temperatures, air densities, etc.).

Some high-end loudspeakers utilize subwoofers with feedback control derived from accelerometers attached to the voice-coil. This approach is undesirable for two reasons. First, the accelerometer adds additional moving mass to the system, thereby reducing efficiency. Second, and most important, the invasive nature precludes its use in low to mid priced systems (i.e. those that dominate the market) as well as the market of consumers that already own subwoofers and are looking for "add on" devices to improve performance.

In view of the foregoing, it would be highly desirable to provide an improved loudspeaker system to achieve a flatter amplitude response and lower distortion in the sub-bass frequency region. Ideally, such a system would be immune from the effects of aging and environmental conditions, such as acoustic venues, temperatures, and air densities.

SUMMARY OF THE INVENTION

A sound producing system includes a loudspeaker to generate an audible signal. A transducer generates a pressure feedback signal from the audible signal. A controller produces a controlled signal for application to the loudspeaker. The controller derives the controlled signal from the pressure feedback signal and an audio input signal. The controlled signal improves the Sound Pressure Level (SPL) frequency response and reduces distortion within a selected bandwidth of the loudspeaker.

The system of the invention extends the performance limits in high fidelity loudspeaker systems. In particular, the invention's analysis and control techniques achieve a flatter amplitude response (both magnitude and phase) and lower distortion in the low-frequency, sub-bass region. The invention exploits feedback control to minimize the effects of system aging and environmental conditions, such as acoustic venues, temperatures, and air densities. The feedback scheme of the invention is based upon pressure signals from a microphone. Thus, unlike prior art accelerometer-based motion feedback schemes, the system of the invention does not add mass to the acoustic elements of the system and is readily retrofitted into existing systems. Advantageously, the system of the invention allows for a reduced loudspeaker size. The invention can be readily exploited in consumer devices, such as high fidelity car audio systems and home theater applications. Professional uses for the invention include movie theaters, recording studios, and concert systems.

BRIEF DESCRIPTION OF THE DRAWINGS

For a better understanding of the invention, reference should be made to the following detailed description taken in conjunction with the accompanying drawings, in which:

FIGS. 6(a) and 6(b) illustrate measured (without control system) loudspeaker frequency responses and corresponding mathematical curves fitting the measured data.

FIGS. 7(a) and 7(b) illustrate loudspeaker harmonic distortion at 20 and 40 Hz, respectively, with and without the controller of the invention.

FIGS. 8(a) and 8(b) illustrate loudspeaker harmonic distortion at 60 and 80 Hz, respectively, with and without the controller of the invention.

Like reference numerals refer to corresponding parts throughout the drawings.

DETAILED DESCRIPTION OF THE INVENTION

Figure 1:
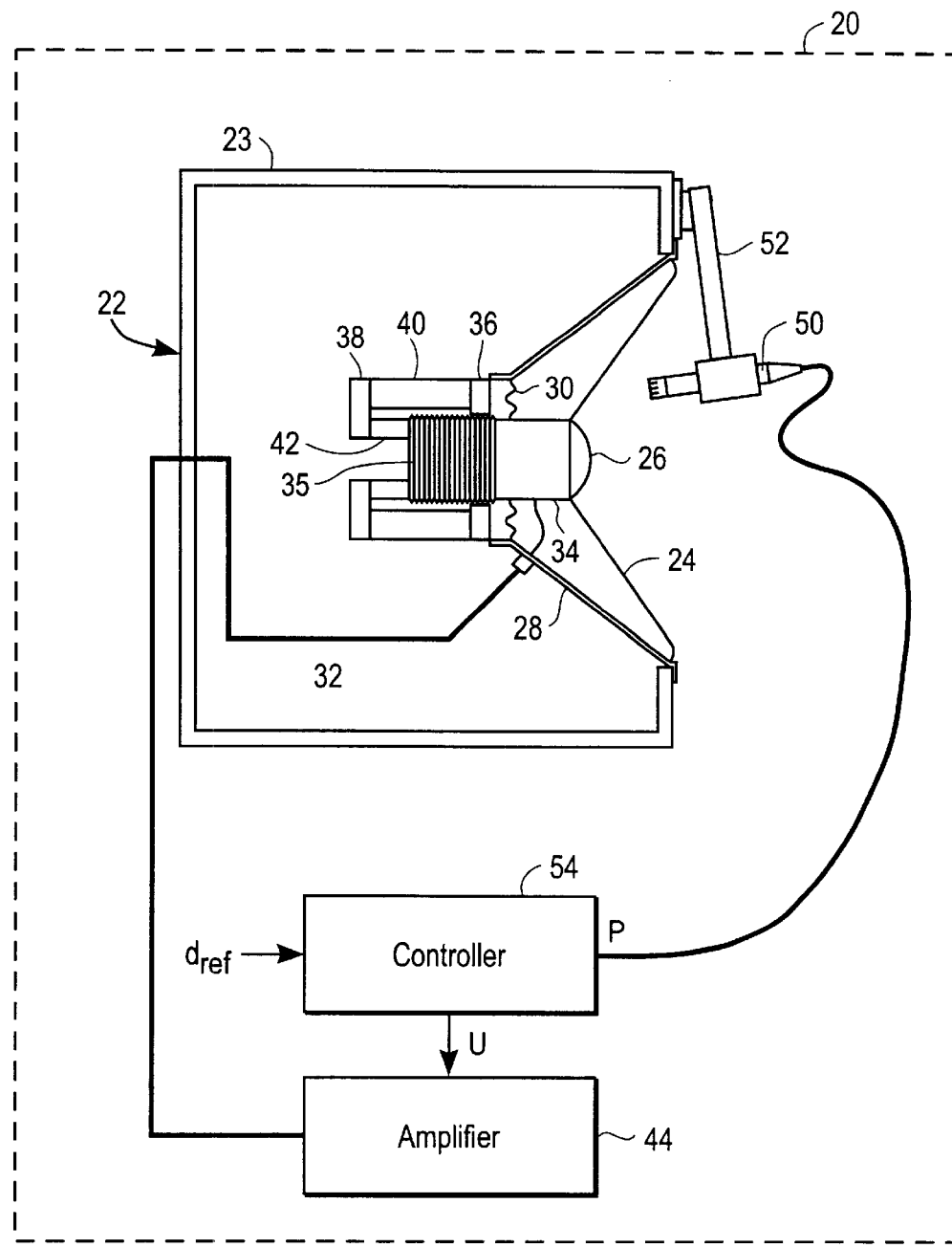
FIG. 1 illustrates a sound producing system in accordance with an embodiment of the invention.

FIG. 1 illustrates a sound producing system 20 in accordance with an embodiment of the invention. The system 20 includes a standard loudspeaker 22. The loudspeaker 22 has a housing 23, which may be a closed or open structure. The housing 23 supports a cone 24, also referred to as a woofer cone or subwoofer cone. A dust cap 26 is positioned at the center of the cone 24. A basket 28 is positioned on the backside of the cone 24. A spider 30 is connected to the basket 28. The foregoing mechanical elements are all well known in the art. Attention now turns to well known electrical elements associated with the loudspeaker 22.

Electrical leads 32 receive a signal from an amplifier 44. The signal is applied to voice coil 35 attached to a voice coil former 34. A top plate 36 and back plate 38 are linked by a magnet 40. A pole piece 42 is connected to the magnet 40. Each of these elements operates in a conventional manner.

In sum, the loudspeaker 22 includes standard components. A standard amplifier 44 provides a signal to the loudspeaker 22. The invention is directed toward the additional elements shown in FIG. 1. Namely, the invention utilizes a microphone 50 to pick-up a pressure feedback signal based upon the audible signal generated by the loudspeaker 22. As shown in FIG. 1, the microphone 50 may be positioned on the housing 23 with a microphone bracket 52. The pressure feedback signal (p) is applied to a controller 54. The controller 54 also receives an audio input signal ($d_{ref}$). As discussed in detail below, the controller 54 derives a controlled signal from the pressure feedback signal and the audio input signal. The controlled signal is subsequently applied to the amplifier 44, where it is amplified and routed to the loudspeaker 22. The controlled signal reduces distortion in the bandwidth of operation as demonstrated below.

Figure 2:
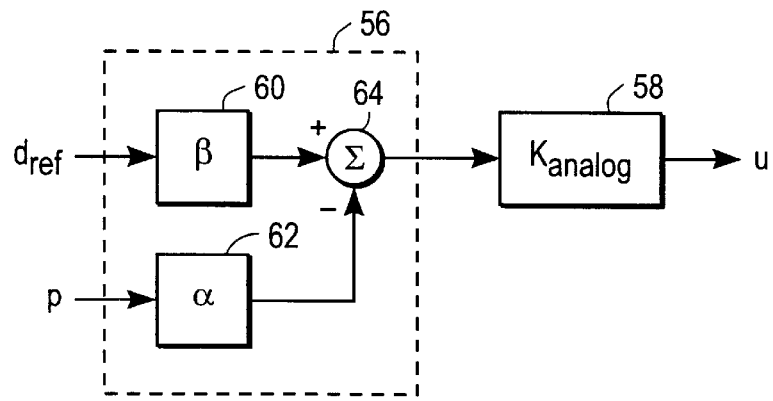
FIG. 2 illustrates a controller in accordance with an embodiment of the invention.

FIG. 2 illustrates a controller 54; in accordance with the invention. The controller includes a summing junction circuit 56. As discussed in detail below, the summing junction circuit 56 has a multiplier 60 to multiply the audio input signal ($d_{ref}$) with a constant gain equalizer factor ($\beta$) to produce a gain adjusted audio input signal. In practice, this is necessary to ensure flexibility with different sources that generate $d_{ref}$ (i.e., $\beta$ acts as a gain adjustment to control the relative loudness of the subwoofer system).

The summing junction circuit 56 also has a multiplier 62 to multiply the pressure feedback signal (P) with a scaling factor ($\alpha$) to produce a scale adjusted pressure feedback signal. As discussed below, the scaling factor is used to ensure that the frequency response has a magnitude of 1 at 100 Hz. A summing circuit 64 subtracts the scale adjusted pressure feedback signal from the gain adjusted audio input signal to form a filter input signal, which is applied to filter 58.

Figure 3:
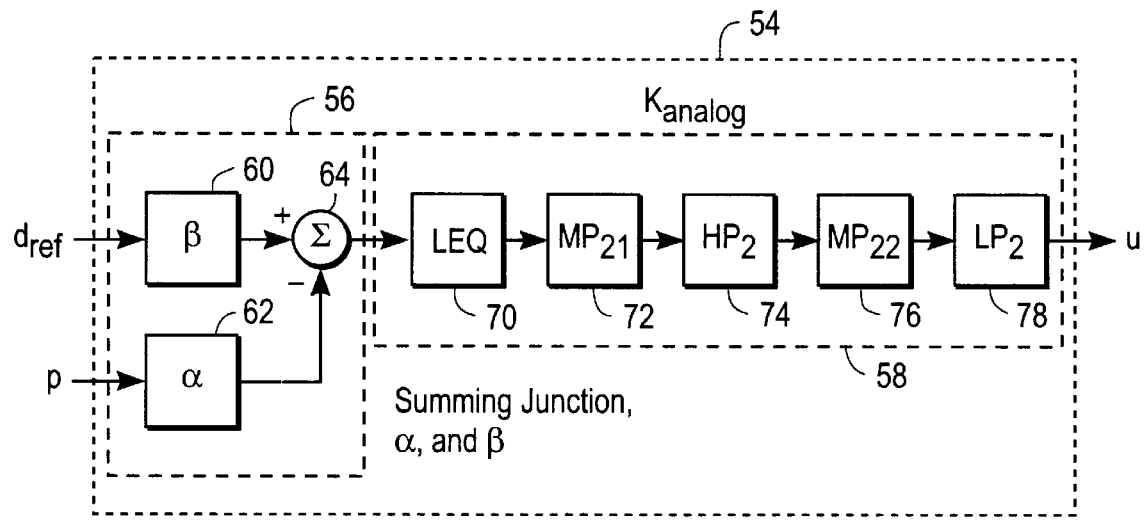
FIG. 3 illustrates a controller and filter in accordance with an embodiment of the invention.
Figure 4A:
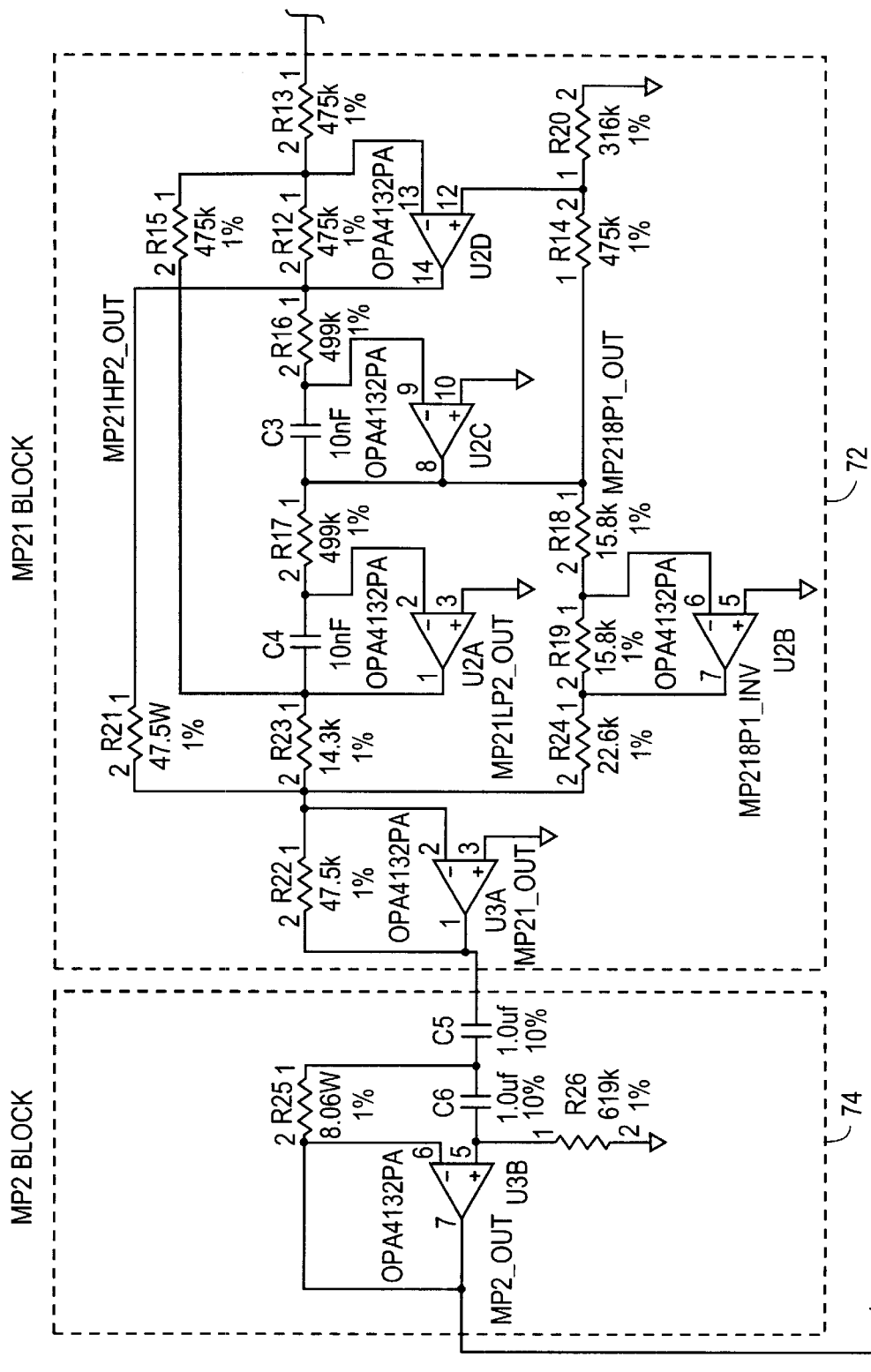
FIG. 4 illustrates an analog filter that may be used in accordance with an embodiment of the invention.
Figure 4B:
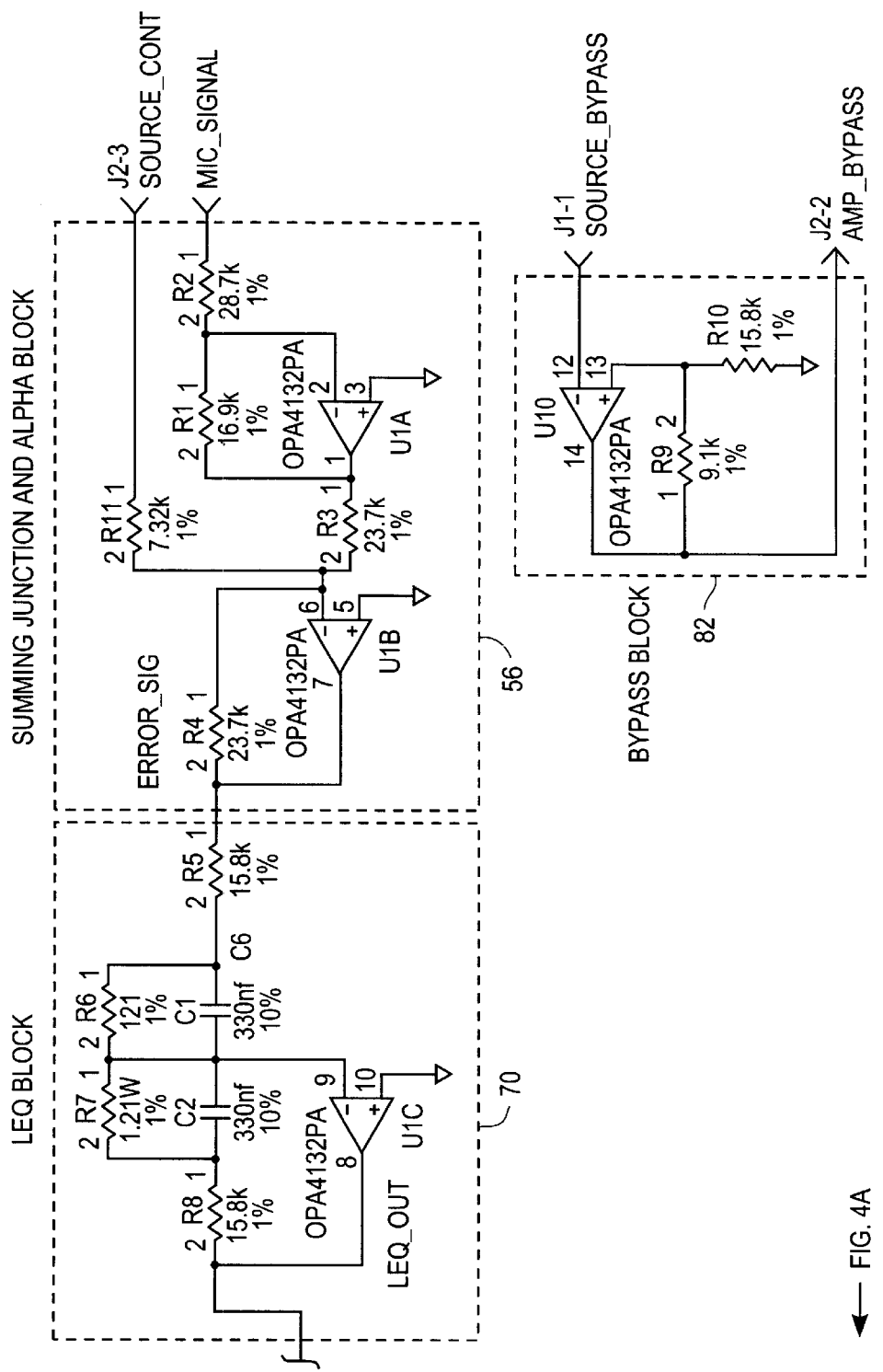
Figure 4C:
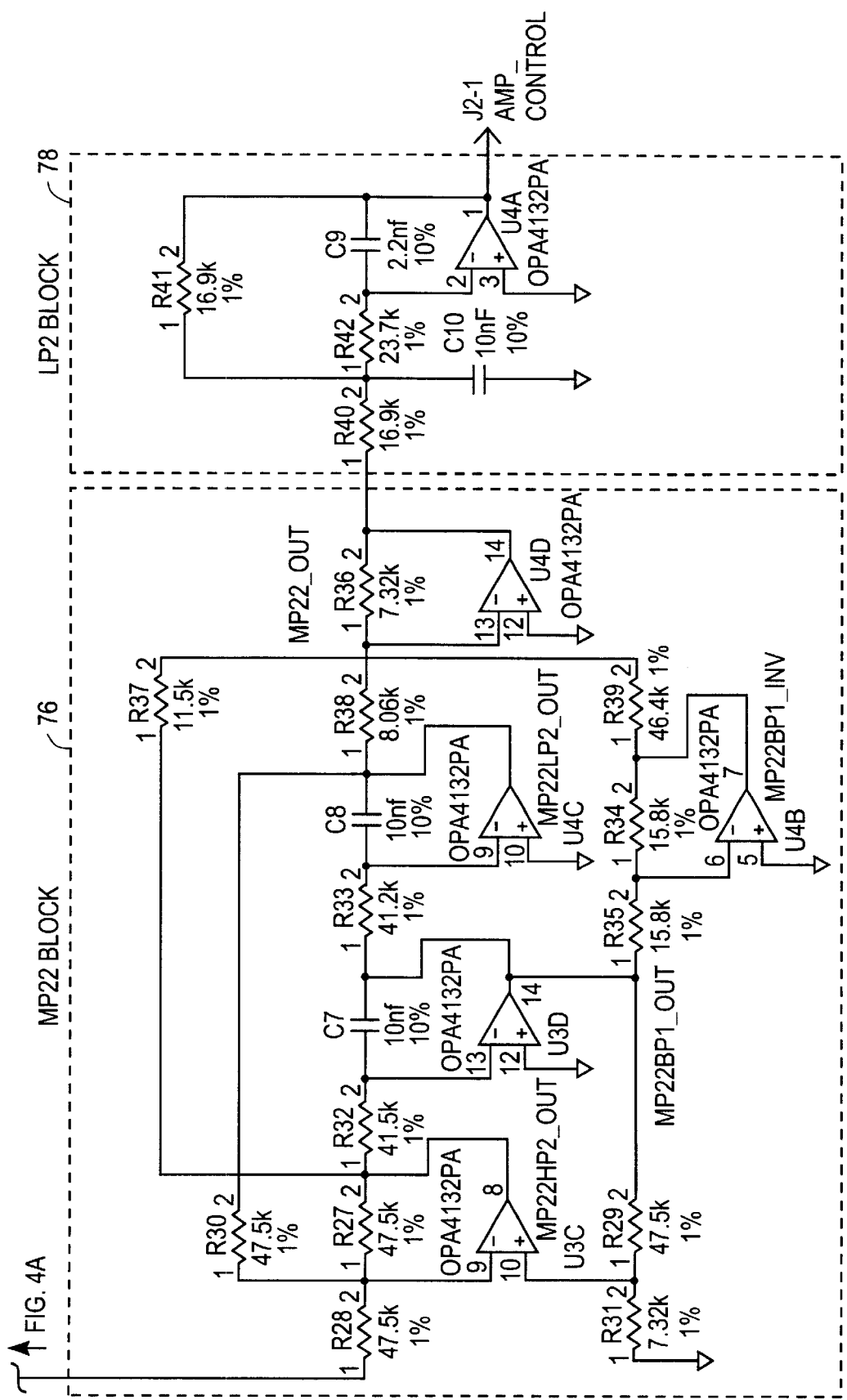
Figure 4D:
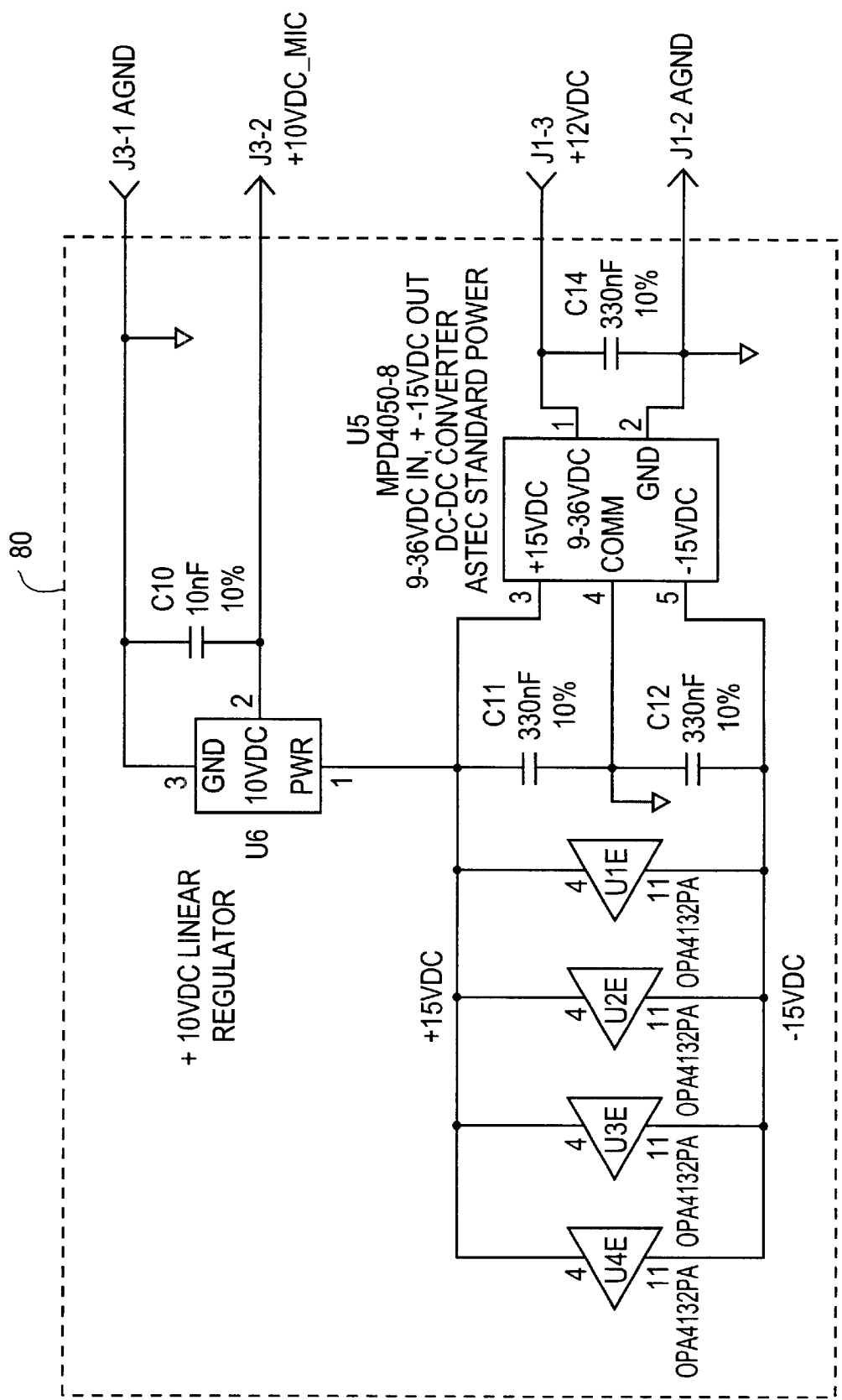

FIG. 3 illustrates a filter 58 utilized in accordance with the invention. The filter 58 includes a low frequency equalizer 70, a multi-pass filter 72, a high pass filter 74, a multi-pass filter 76, and a low pass filter 78. A specific implementation of these filters is shown in FIG. 4. The transfer functions associated with these filters are provided below. The specific filters of FIGS. 3 and 4, which are discussed below, are provided for the purpose of illustration. Those skilled in the art will recognize that the modeling techniques of the invention can be used to produce any number of related designs.

Figure 5:
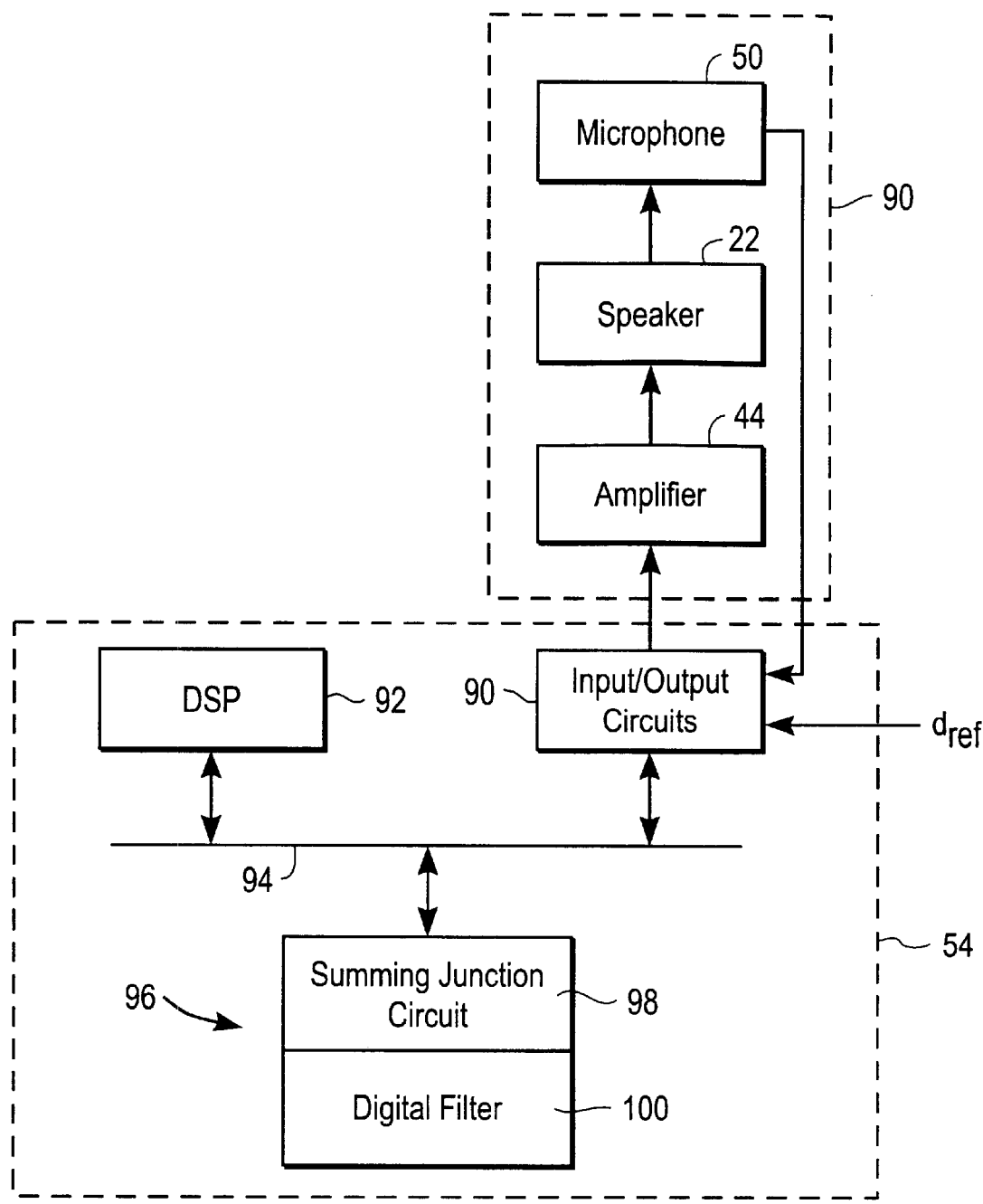
FIG. 5 illustrates a digital filter that may be used in accordance with an embodiment of the invention.
Figure 9:
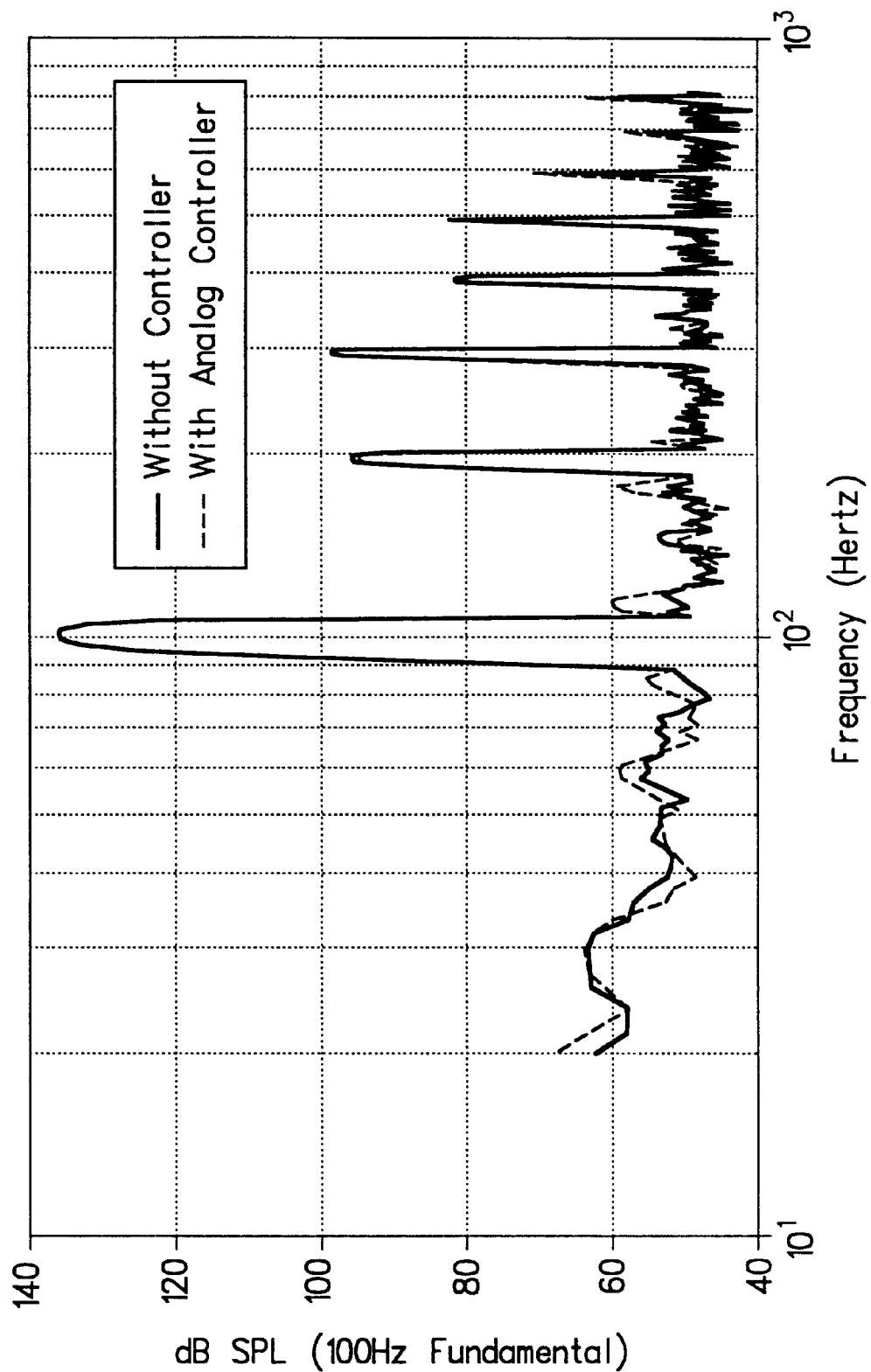
FIG. 9 illustrates loudspeaker harmonic distortion at 100 Hz, with and without the controller of the invention.

FIG. 5 illustrates a digital filter implementation of the invention. FIG. 5 illustrates a plant 90, which includes amplifier 44, loudspeaker 22, and pressure transducer (e.g., microphone) 50. The pressure feedback signal from the microphone 50 is applied to a digital filter 54. The digital filter 54 includes a set of input/output circuits 90. The I/O circuits include analog-to-digital and digital-to-analog conversion circuits and other standard circuits for interfacing with the plant 90. The digital version of the pressure feedback signal is applied to a digital signal processor 92 over system bus 94. The digital signal processor 92 interacts with a memory 96, which stores a number of programs, including a summing junction circuit module 98, and a digital filter module 100. The summing junction circuit module 98 and the digital filter module 100 perform the same function as the analog devices illustrated in FIGS. 2 and 3.

The foregoing brief overview of the invention will allow those skilled in the art to recognize a number of benefits with the disclosed technology. First, the feedback scheme of the invention is based upon pressure signals from a pressure transducer. Thus, unlike prior art accelerometer-based motion feedback schemes, the system of the invention does not add mass to the acoustic elements of the system and is readily retrofitted into existing loudspeaker systems.

As discussed below, the invention's analysis and control techniques achieve a flatter frequency response (both magnitude and phase) and lower distortion in the operating bandwidth. The invention exploits feedback control to minimize the effects of system aging and environmental conditions, such as acoustic venues, temperatures, and air densities. Advantageously, the system of the invention allows for a reduced enclosure size. That is, the performance of a smaller enclosure is greatly enhanced, and therefore it is not necessary to utilize a larger enclosure, which would otherwise be necessary for the same performance.

Now that the invention and its benefits have been introduced, attention turns to a more thorough discussion of the design and use of a sound producing system in accordance with the invention.

As previously mentioned, FIG. 1 illustrates a schematic of a loudspeaker 22 in a sealed enclosure. Generally, subwoofers are large-diameter (between 6" to 18"), high-compliance, low-resonance, voice-coil transducers. The system is acoustically modeled as a single-vent, Helmholtz resonator with a rigid, baffled, electromechanically driven plane-piston attached to the opening. Therefore, acoustic radiation emanates almost entirely from the moving cone 24. When modeled as a Linear, Time Invariant (LTI) system (typically with second order dynamics), the voice-coil transducer 34 connected to the cone is assumed to operate with small input signals. On the other hand, the nonlinearities in the loudspeaker 22 cannot be ignored when the loudspeaker is driven at the extremes of its operating range. The dominant nonlinearities are due to the non-uniform magnetic field surrounding the voice-coil 35, the dependence of the voice-coil self inductance on cone position, and the cone 24 perimeter (surround) and spider 30 behaving like stiffening nonlinear springs.

The microphone 50 (e.g., mounted 1.25" away from the cone's surface) measures the near-field (distances comparable to the radius of the loudspeaker) pressure for feedback use. The microphone is attached as close as possible without mechanical interference with the cone to minimize the time required for the cone's acoustic output to reach the microphone, and to improve its sensitivity to cone pressure as opposed to environmental disturbances. Even though the cone is considered rigid at low frequencies, structural resonance modes for the cone (usually called breakup modes) are significant at frequencies having wavelengths smaller than twice the cone's base diameter (typically greater than 750 Hz for 18" loudspeakers). Since low-frequency performance is of concern here, the breakup modes are unimportant and serve only to add to the complexity of the loudspeaker's model and limit the potential bandwidth of the controlled subwoofer system.

To reduce the microphone's sensitivity to symmetric cone breakup modes at high frequencies, it is positioned asymmetrically with respect to the acoustic axis of the loudspeaker (typically the axis of symmetry for the cone). Typically, a modern subwoofer's diameter is smaller than one half of the wavelength of the highest operating frequency, hence its near-field pressure region becomes vanishingly small when the loudspeaker is placed in an anechoic space. This implies that the entire acoustic field has a far-field (distances much larger than the radius of the cone) behavior and the Sound Pressure Level (SPL) at a given point is inversely proportional to the distance from the loudspeaker center. Moreover, the far-field pressure is non-directional at low-frequencies (i.e. the pressure is essentially the same at points on the sphere of fixed radius around the subwoofer). Therefore, correcting the subwoofer's SPL response at the microphone location should improve the response everywhere in the acoustic field.

Recent studies in low frequency psycho-acoustics indicate that the most significant (and likely-to-be-heard) type of distortion is harmonic and the most bothersome harmonics are of odd order. Just-audible limits for harmonic distortion in the sub-bass region for an output fundamental between 80 and 110 dB SPL re 20 µPa (without weight, at each ear's pinna) have been set. Distortion limits of 3% (relative to the fundamental) for the second harmonic, 1% for the third harmonic, and 0.3% for higher-order harmonics have been found to be suitable guidelines in determining the subwoofer's performance. Since the results discussed herein were made in a laboratory instead of an anechoic chamber, measurements taken far away from the loudspeaker's center may show some room modes. The ideal testing method is to place the evaluation microphone as close to the loudspeaker cone as possible in order to minimize the influence of room interactions on the measured pressure. Therefore, the distortion objective is satisfied by measuring and reducing the Total Harmonic Distortion (THD) of the loudspeaker system for reference, sinusoidal inputs producing output fundamentals ranging between 120 (for the 20 Hz fundamental) and 140 dB SPL re 20 µPa (for the 100 Hz fundamental) at various frequencies in the sub-bass region (measured 1.25" from the cone). These outputs produce average pressures between 80 and 110 dB SPL throughout the laboratory which are suitable for distortion audibility comparison tests. Assuming a steady-state, periodic input signal with frequency ω, the harmonic distortion measures are typically defined as $$THD(\omega) = 100 \times \sqrt{\frac{\sum_{i=2}^{N} R_i^2}{\sum_{i=1}^{N} R_i^2}} \; \% \text{ and} \tag{1}$$

$$HD(\omega)_j = 100 \times \frac{R_j}{R_1} \; \%, \tag{2}$$

where $R_i$ is the ith harmonic's Root-Mean-Square (RMS) pressure output, N is the total number of harmonic peaks present in the output, and $HD(\omega)$, is the harmonic distortion of the jth order relative to the fundamental (at ω).

In order to analyze the full extent of the subwoofer's output, two types of experiments were utilized: broadband, small amplitude sine-sweeps to measure the nominal frequency response, and fixed-frequency large amplitude sine-wave tests to measure the harmonic distortion. The experiments were performed in a 38 ft. long, 19 ft. wide, and 15 ft. high laboratory with concrete walls, carpeted floor, and a ceiling covered with acoustical tile. The room had a noise floor of 65 dB SPL re 20 µPa (without weight). Using RMS averaging and uniform windowing techniques, FIGS. 6(a) and 6(b) show the open-loop (i.e., no control system) frequency response of a closed-box loudspeaker system (from the voltage into the amplifier to the voltage from the microphone) while FIGS. 7(a), 7(b), 8(a), 8(b), and 9 illustrate the harmonic structure of the SPL for output fundamentals with levels between 120 and 140 dB SPL re 20 µPa (1.27" from the loudspeaker) at 20 and 40, 60 and 80, and 100 Hz, respectively. The THD and HD values are included in Table 1. Although the RMS level of the measured fundamentals differed across the frequency range, the input level at the loudspeaker's terminals was kept at a constant value (25 Volts RMS).

TABLE 1

The THD & $HD_j$ at levels between 120 & 140 dB SPL (for the fundamental)

| Fundamental | THD (%) | | | $HD_j$ (%) | |
|---|---|---|---|---|---|
| Frequency (Hertz) | Without Control | With Control | j | Without Control | With Control |
| 20 | 7.03 | 3.93 | 2 | 2.70 | 1.64 |
| | | | 3 | 6.42 | 3.53 |
| | | | 4 | 0.80 | 0.40 |
| | | | 5 | 0.35 | 0.18 |
| 40 | 1.33 | 0.74 | 2 | 0.74 | 0.40 |
| | | | 3 | 1.09 | 0.60 |
| | | | 4 | 0.08 | 0.05 |
| | | | 5 | 0.09 | 0.07 |
| 60 | 1.57 | 0.85 | 2 | 1.53 | 0.82 |
| | | | 3 | 0.34 | 0.20 |
| | | | 4 | 0.11 | 0.07 |
| | | | 5 | 0.07 | 0.07 |

TABLE 1-continued

The THD & $HD_j$ at levels between 120 & 140 dB SPL (for the fundamental)

| Fundamental Frequency (Hertz) | THD (%) Without Control | THD (%) With Control | j | $HD_j$ (%) Without Control | $HD_j$ (%) With Control |
|---|---|---|---|---|---|
| 80 | 1.58 | 0.99 | 2 | 1.50 | 0.91 |
|  |  |  | 3 | 0.50 | 0.39 |
|  |  |  | 4 | 0.02 | 0.04 |
|  |  |  | 5 | 0.09 | 0.09 |
| 100 | 1.75 | 1.52 | 2 | 0.99 | 0.70 |
|  |  |  | 3 | 1.43 | 1.32 |
|  |  |  | 4 | 0.19 | 0.20 |
|  |  |  | 5 | 0.21 | 0.20 |

The test loudspeaker 22 included an 18" professional grade subwoofer (AURA 1808). The performance of this device represents the leading edge in low-distortion, high-output sub-bass reproduction. Although a ported, 8 ft$^3$ enclosure was recommended by the manufacturer for optimum performance, the transducer was mounted in a custom-made 4 ft$^3$ enclosure in a sealed configuration. This setup purposely limited the low-frequency reproductive potential of the loudspeaker. However, the resulting system was more compact, rigid, and lightweight, making applications in automobiles possible. The plant also included a voltage-drive amplifier of similar quality, capable of producing 700 Watts RMS of continuous power (QSC MX1000a). A low-noise, high-quality electret condenser microphone used to measure the pressure produced by the loudspeaker was also part of the plant dynamics model (LinearX M51). This microphone's pressure signal was used for feedback control, as well as for evaluating the pressure response of the subwoofer. The plant data were obtained from a vector-averaged, 512 point Fast Fourier Transformed (FFT) pressure signal measurement (uniform window) and a sine-sweep input using a HP35660A Dynamic Signal Analyzer. Rather than produce the frequency response by calculating the ratio between the output and input linear spectrums, the response was obtained by calculating the ratio of the cross spectrum to the input's power spectrum. This method is more accurate and provides a better statistical estimate of the true frequency response. The input signal amplitude was kept small for the broadband test so that the maximum cone excursion did not exceed the manufacturer-specified linear displacement limit (±0.5 in). The Single Input, Single Output (SISO) linear model fit ($G_{nom}$) in FIGS. 6(a) and 6(b) was obtained using a seventh-order, frequency-domain weighted least-squares algorithm performed with the MATLAB™ software. The plot shows a good fit in the region between 20 Hz and 300 Hz and also shows the predicted second-order behavior at the operating frequency range. Also, the plant exhibits a pair of non-minimum phase zeros at 12.5 Hz and another zero at 911 Hz. These zeros will limit the allowable performance bandwidth of the closed loop system.

In FIGS. 7(a), 7(b), 8(a), 8(b), and 9, and in Table 1 (for the case without control), the nonlinear nature of the plant is indicated by the presence of substantial harmonic distortion artifacts. Even though the subwoofer used was one of the most linear, high-output devices available, the harmonic distortion exceeded the just-audible limits. More specifically, the loudspeaker failed the distortion audibility test for the fundamental frequencies between 20 ($HD_3$, $HD_4$, and $HD_5$ were too large) and 40 Hz ($HD_3$ was too large) and at 100 Hz ($HD_3$ was too large, as well). This performance deficit is removed in accordance with the techniques of the invention.

The first design objective was to flatten and extend both the magnitude and phase of the loudspeaker's pressure response at low frequencies. For small input signals, this can be considered a linear objective and LTI control theory can be applied. The implemented control system is shown in FIG. 1. In FIG. 1, consider a plant "G" to include the loudspeaker 22, the amplifier 44, and the microphone 50, the controller is C, $d_{ref}$ is the signal from the subwoofer crossover, u is the control signal to the amplifier, and p is the pressure measurement from the microphone for feedback. It should be noted that the exogenous disturbances and noises are not shown in this figure. The linear objective of Robust Control can be divided into three design goals:

1. Nominal Performance: Achieve a flatter pressure frequency response (both magnitude and phase) in the presence of exogenous disturbances and noises (e.g. sounds not produced by the subwoofer, sensor and controller noises, etc.).
2. Robust Stability: Stability in the presence of plant uncertainties (e.g. modeling errors, temperature changes, humidity, aging, changes in the acoustic field, etc.).
3. Robust Performance: Achieve the performance in the presence of plant uncertainties.

The design approach follows the continuous-time domain $\mu$-*Analysis* and *Synthesis* approach applied to Multi-Input, Multi-Output (MIMO) systems as proposed by G. Stein and J. C. Doyle, "Beyond Singular Values and Loop Shapes", *A.I.A.A. Journal of Guidance and Control*, 14:5–16, 1990 and described by Packard et al., "Linnear Multivariable Robust Control with a $\mu$ Perspective", *ASME Journal of Dynamic Systems, Measurement and Control*, Vol. 115, pp. 426–438, June 1993.

Figure 10:
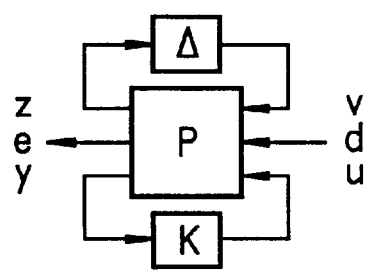
FIG. 10 illustrates a $\mu$-Analysis and Synthesis framework that may be utilized to design a controller in accordance with the invention.

FIG. 10 shows the general representation of the problem. The problem description is complete when the representation is combined with an appropriate magnitude measure for matrix transfer functions and several key results. The generalized system P contains three pairs of input/output variables: The control inputs u(t) and the measured outputs y(t), the disturbances d(t) and performance variables e(t), and the signals v(t) which contain unit-norm perturbations that are fed back into P and the output signals to the perturbation $\Delta$, z(t). Therefore, any linear interconnection of inputs and outputs can be cast into this general framework.

Figure 11:
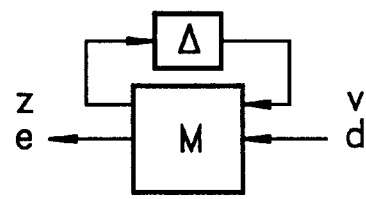
FIG. 11 illustrates a $\mu$-Analysis framework that may be utilized to design a controller in accordance with the invention.

From FIG. 10, the system in FIG. 11 is obtained and a non-conservative necessary and sufficient condition for robust performance can be found. M(P,K) contains a 2×2 block-structured transfer function M(s) which is defined in terms of a 3×3 partition of P(s) in the original interconnect in FIG. 10 by $$M_{ij}(s) = P_{ij}(s) + P_{i3}(s)[I - K(s)P_{33}(s)]^{-1} K(s) P_{3j}(s), \ ij=1,2. \quad (3)$$

Formulation 3 is referred to as a Linear Fractional Transformation of P through K, hence M(P,K). The following is true when the system shown in FIG. 11 is stable:

1. Nominal Performance is achieved if and only if $$\|M_{22}(j\omega)\|_\infty < 1. \quad (4)$$

2. Robust Stability is achieved if and only if $$\|M_{11}(j\omega)\|_\infty < 1. \quad (5)$$

3. Robust Performance is achieved if and only if $$\mu[M(j\omega)] < 1 \quad \forall \omega, \tag{6}$$

where $$\mu[M] := \left[ \min \left\{ \epsilon \left| \begin{array}{c} det[I - \epsilon XM] = 0 \\ \text{for some } X = diag(\Delta_1, \Delta_2) \\ \text{with } \|\Delta_i\|_\infty < 1, \forall i \end{array} \right\} \right]^{-1}, \tag{7}$$

i.e., $\mu$ is the reciprocal of the smallest scalar $\epsilon$ which makes I $-\epsilon XM$ singular for some X in a block diagonal perturbation set. $\mu$ is zero if no $\epsilon$ exists.

It should be noted that in the actual analysis process, $\mu[M]$ is computed as a function of frequency.

The function $\mu$ is characterized by the observation that robust performance is equivalent to robust stability in the presence of two perturbations $\Delta$, and $\Delta_p$, which are connected around M (P,K). Therefore, robust stability is guaranteed if and only if $$det\ (I-\text{diag}\ (\Delta, \Delta_p)\ M(j\omega)) \neq 0 \ \forall \omega \tag{8}$$

This is a tight condition for robust stability with respect to two perturbation blocks (and equivalently, for robust performance). Since the definition in 7 can also be used to test for stability with respect to many diagonal blocks (not just 2×2 block structures), it can be utilized to test robust stability with respect to plant sets characterized by several unstructured perturbations (and at the same time, test robust performance, as well).

Figure 12:
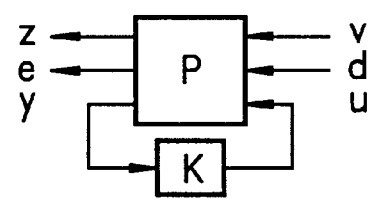
FIG. 12 illustrates a $\mu$-Synthesis framework that may be utilized to design a controller in accordance with the invention.

The synthesis problem is to find a controller K such that the performance objectives are met under specified uncertainties. FIG. 12 shows the synthesis framework where the perturbations are normalized to unity and the normalizing factors are absorbed into P. P is partitioned so that the map from $$\begin{bmatrix} v \\ d \end{bmatrix} \text{ to } \begin{bmatrix} z \\ e \end{bmatrix}$$

is described by a lower linear fractional transformation, $F_L$ where $$\begin{bmatrix} v \\ d \end{bmatrix} = F_1(P, K) \begin{bmatrix} v \\ d \end{bmatrix} = M(P, K) \begin{bmatrix} v \\ d \end{bmatrix}. \tag{9}$$

The goal is to find a stabilizing controller such that $$\|F_L(P,K)\|_{2s} < \gamma, \tag{10}$$

where $\gamma$ is the inverse of the minimum norm of the perturbation that causes the closed-loop system to become unstable. This goal is referred to as the $H_\infty$ optimal problem.

Combining the analysis and synthesis frameworks in a systematic fashion such that the $H_\infty$ optimal control methods and the structured singular value ($\mu$) theory are used for synthesis and analysis, respectively, results in the $\mu$-Analysis and Synthesis algorithm. The method reduces to finding a stabilizing controller K and a scaling matrix D that minimize $\|DF_1\ (P,K)\ D^{-1}\|_\infty$. In practice, this is solved by fixing D and minimizing with respect to K ($H_\infty$problem), then fixing the resulting K and peforming the minimization with respect to D (convex in ln(D)), point-wise in frequency. The resulting D(jw) is then fit with a real-rational, stable, and minimum phase invertible transfer function. The algorithm is repeated until a suitable minimum is achieved. This is referred to as the D-K Iteration algorithm and is explained in more detail in G. Stein and J. C. Doyle, Beyond Singular Values and Loop Shapes, *A.I.A.A. Journal of Guidance and Control*, 14:5–16, 1990, and in G. J. Balas, J. C. Doyle, K. Glover, A. K. Packard, and R. Smith, $\mu$-Analysis and Synthesis Toolbox, The MathWorks, Natick, M A, Janauary 1994.

The second control objective was to reduce the subwoofer's distortion. FIGS. 7(a), 7(b), 8(a), 8(b), and 9, and Table 1 (for the case without control) show that even the leading edge in loudspeaker technology falls short of following nonlinearity guidelines. As a matter of fact, THD values in excess of 25% at frequencies below 50 Hz are not uncommon for subwoofers. Several techniques involving the direct inversion of the loudspeaker's nonlinearities have been suggested. The proposed techniques involve elaborate off-line identification of the nonlinear elements in the loudspeaker, a process which requires complicated signal processors. Moreover, the identification must be repeated if changes are made to the loudspeaker system (including changes due to the loudspeaker's surroundings). In addition, these techniques don't offer the kind of robustness against plant variations nor the exogenous disturbance rejection ability that feedback systems normally possess. Also, the techniques are only effective in inverting a specific set of nonlinearities which, although dominant, are not necessarily the only ones existing in loudspeakers. The methods are especially poor in reducing the effect of time varying loudspeaker parameters. In contrast, the control method of the invention solves all of the aforementioned problems.

Control systems studies have determined that well designed closed-loop systems with LTI controllers attain robust stability and performance in the face of sector-bound plant nonlinearities. For plants that are nominally linear (i.e. relatively linear for small signals), reductions in nonlinear distortion are achieved when incorporating an LTI controller. Open-loop and closed-loop distortion $e_o$ and $e_c$, respectively, are related by:

$$e_c \approx S e_o, \tag{11}$$

where $$S := (I - C_{pu}G)^{-1} \tag{12}$$

is the linear operator referred to as the sensitivity function of the closed loop system in FIG. 1. $C_{pu}$ is the controller's transfer function from p to u. Therefore, minimizing S guarantees distortion reduction. Since sensitivity reduction is typically one of the goals of most carefully designed systems incorporating LTI controllers and since S+T=1 (where T:=$-C_{pu}G\ (I-C_{pu}G)^{-1}$ is the closed-loop frequency response from $d_{ref}$ to p or, the complementary sensitivity function), keeping S at a minimum using the $\mu$-control design approach implies flattening the SPL response (S→0←T→1) and reducing the distortion of the loudspeaker system. This fact also holds true in the region far away from the frequencies of transmission zeros when G is non-minimum phase. This is the case for the subwoofer plant where the non-minimum phase zeros' frequencies are distant from the sub-bass region. This advantage allows for the construction of a simple LTI controller without the need for more complicated nonlinear processors or elaborate electronics.

Figure 13:
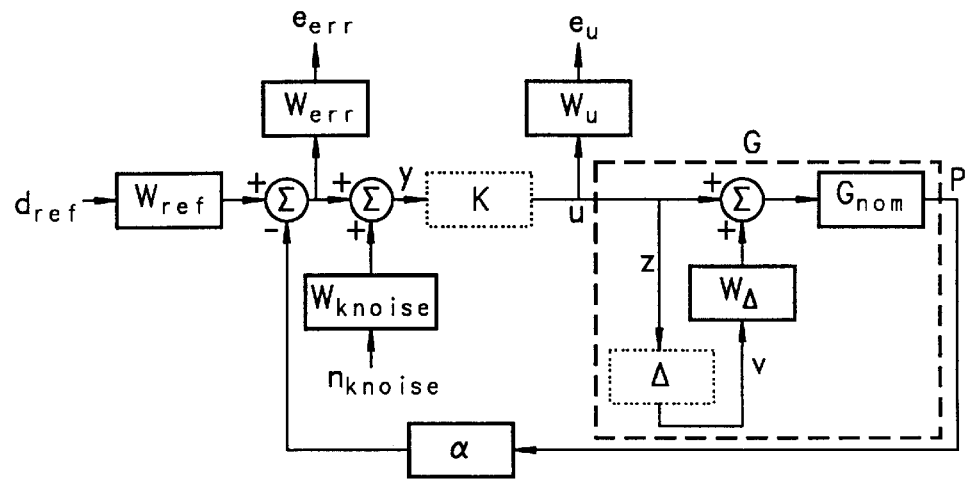
FIG. 13 illustrates an open loop interconnect model of a loudspeaker plant in accordance with an embodiment of the invention.

FIG. 13 is a diagram for the closed-loop system model containing considerations (in terms of weighting functions) which are necessary in achieving the design goals of the invention. By opening the connections around $\Delta$ and K (the dotted blocks) and combining the disturbance and error signals, the system is transformed into P, the open-loop interconnection structure shown in FIG. 14 which is suitable for the µ-framework described above. Therefore, P is a 4×4 interconnection structure and the blocks and signals involved are defined as follows:

$n_{knoise}$ The noise due to the controller, K.

$d_{ref}$ The reference signal (desired response).

$e_{err}$ The weighted error (sensitivity) signal.

$e_u$ The weighted control signal.

d(2) The disturbance vector $$\begin{bmatrix} n_{knoise} \\ d_{ref} \end{bmatrix}.$$

e(2) The error vector $$\begin{bmatrix} e_{err} \\ e_u \end{bmatrix}.$$

α A scaling such the output p has a magnitude of 1 at 100 Hz for $d_{ref}=1$.

$W_\Delta$ The multiplicative uncertainty's weight.

$W_{err}$ The error signal's performance weight.

$W_{knoise}$ The controller noise's penalty weight.

$W_u$ The control signal's performance weight.

$W_{ref}$ The reference signal's penalty weight.

To accurately reflect the control objectives in the µ-framework, frequency-dependent weights multiplying the appropriate signals are utilized. The design of the weights in FIG. 13 are detailed as follows:

Uncertainty Modeling

The dashed block in FIG. 13 is a representation of the "true" loudspeaker model, G as illustrated in FIG. 1 (G being equivalent to the amplifier 44, loudspeaker 22, and microphone 50). The elements $W_\Delta$ and $\Delta$ parameterize the modeling uncertainty. The uncertainty model is referred to as the multiplicative uncertainty at the plant input which is described by $$G = G_{nom}(I + W_\Delta \Delta). \tag{13}$$

Figure 15:
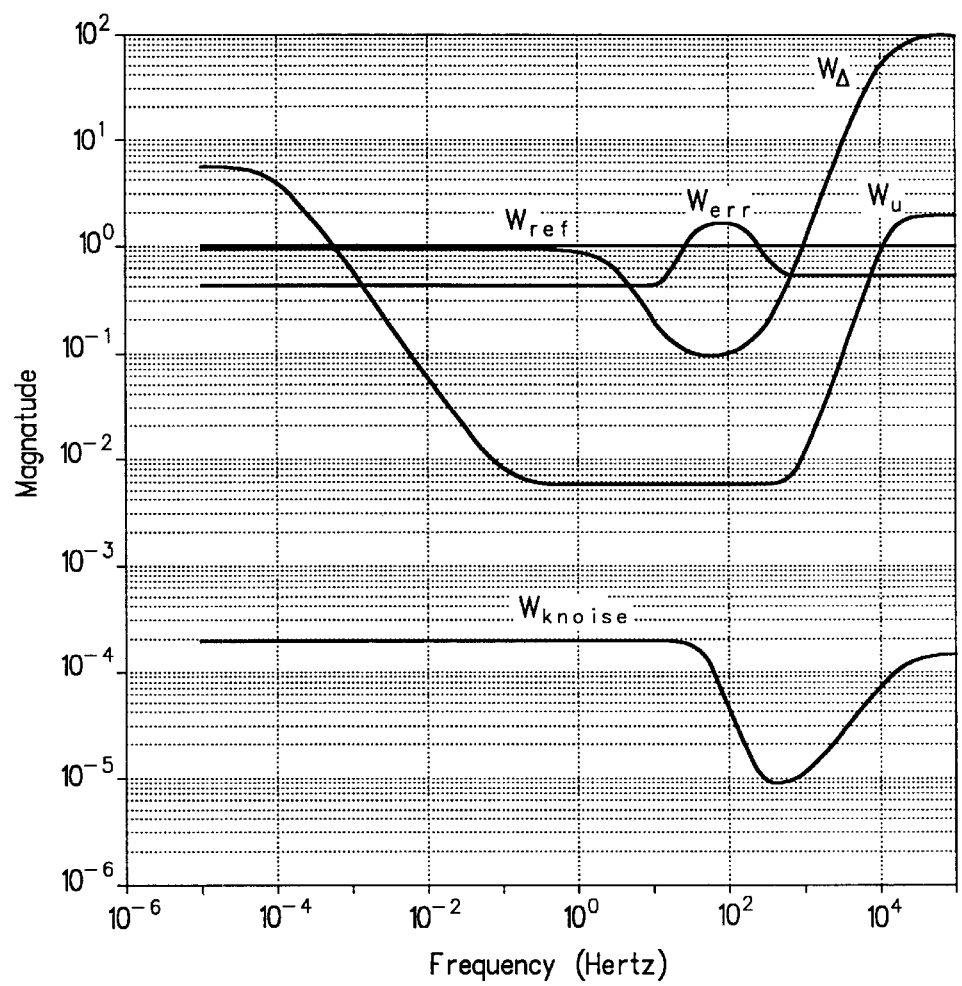
FIG. 15 illustrates uncertainty and performance weights in accordance with an embodiment of the invention.

FIG. 15 shows the frequency response of $W_\Delta$. The fourth-order, stable weight reflects the potential percentage (for instance, interpret 0.1 as 10%) variation in the uncontrolled loudspeaker system's voltage-pressure response from its measured response $G_{nom}$ (FIG. 6). The potential Variations in behavior are frequency-dependent, which is quite typical for dynamical models, where uncertainty depends on frequency. This weighting function is explicitly used in the controller design optimization step, to desensitize the optimization to the single measured response $G_{nom}$. This precisely allows the controlled system to be impervious, and insensitive to effects of system aging, environmental conditions, additional modling errors, temperature changes, humidity, and changes in the environment's impedance. In this example, the potential uncertainty starts out large at very low frequencies, decreases in the band of interest, reaching a minimum of 10% at 60 Hz., and then increases to 10,000% at higher frequencies. Furthermore, the weight was designed such that the bandwidth limit set by the non-minimum phase zeros was not exceeded (i.e. the open-loop gain, $-C_{pu}G$ is forced to be less then unity in the intervals (0,12.5 Hz) and (911 Hz, ∞).

Performance Weight

This weight is used to reflect the desired closed-loop frequency response of the system from $d_{ref}$ to $e_{err}$. Therefore, the closed-loop response will not exceed $W_{err}^{-1}$ in magnitude. Since the response is that of the sensitivity function (S), distortion is guaranteed to be at least reduced by the factor $W_{err}^{-1}$ and the SPL response will be flatter in the region where S remains low. The weight was designed as a stable, fourth-order transfer function which is shown in FIG. 15. $W_{err}^{-1}$ is kept low in the sub-bass region such that it guarantees that S<1 from 25 Hz to 250 Hz and that S achieves a minimum <0.6 at 80 Hz. Also, the weight demands no performance where the plant uncertainty is high and at frequencies away from the open-loop bandwidth allowed by the transmission zeros. In addition, the weight was designed to minimize the unavoidable peaks above unity in the magnitude response of the sensitivity function (due to the non-minimum phase behavior of the plant) outside the performance bandwidth.

Reference Signal Weight

To reflect the ideal response to the input command ($d_{ref}$), $W_{ref}$ was designed. Since a scales the pressure signal to match the units of $d_{ref}$ and since the goal is to track $d_{ref} W_{ref}$ is set equal to 1.0 ($W_{ref}$:=1.0), as shown in FIG. 15.

Noise Weight

Noise from the measured pressure, plant, and controller were considered. Using iterative refinement of the control design, the stable, third order $W_{knoise}$ shown in FIG. 15 is treated as the upper-bound for the actual noise measure in u (FIG. 13). Since the equipment used to construct the plant and the controller represented the state-of-the-art in current technology, noise was not of significant magnitude.

Control Signal Weight

The control signal was required to have an upper-bound to prevent the amplifier from saturating, with possible damage to the loudspeaker. As a result, the third-order, stable $W_u$ was formulated such that $W_u^{-1}$ was the upper limit of the control signal u, as shown in FIG. 15. By limiting the control action at high frequencies, this weight further helped in high-frequency noise rejection and in shaping the high frequency part of S.

Figure 14:
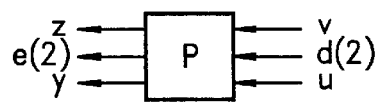
FIG. 14 illustrates a transformed interconnection structure utilized in accordance with an embodiment of the invention.

The weights were substituted into the interconnection structure in FIG. 13 and the open-loop interconnect shown in FIG. 14 was generated. The resulting P is a stable 4×4, $21^{st}$-order transfer function and the robust performance perturbation structure is described by $$\Delta := \{\text{diag}\,(\Delta, \Delta_p): \Delta \in C^{1\times 1}, \Delta_p \in C^{2\times 2}\}. \tag{14}$$

Figure 16:
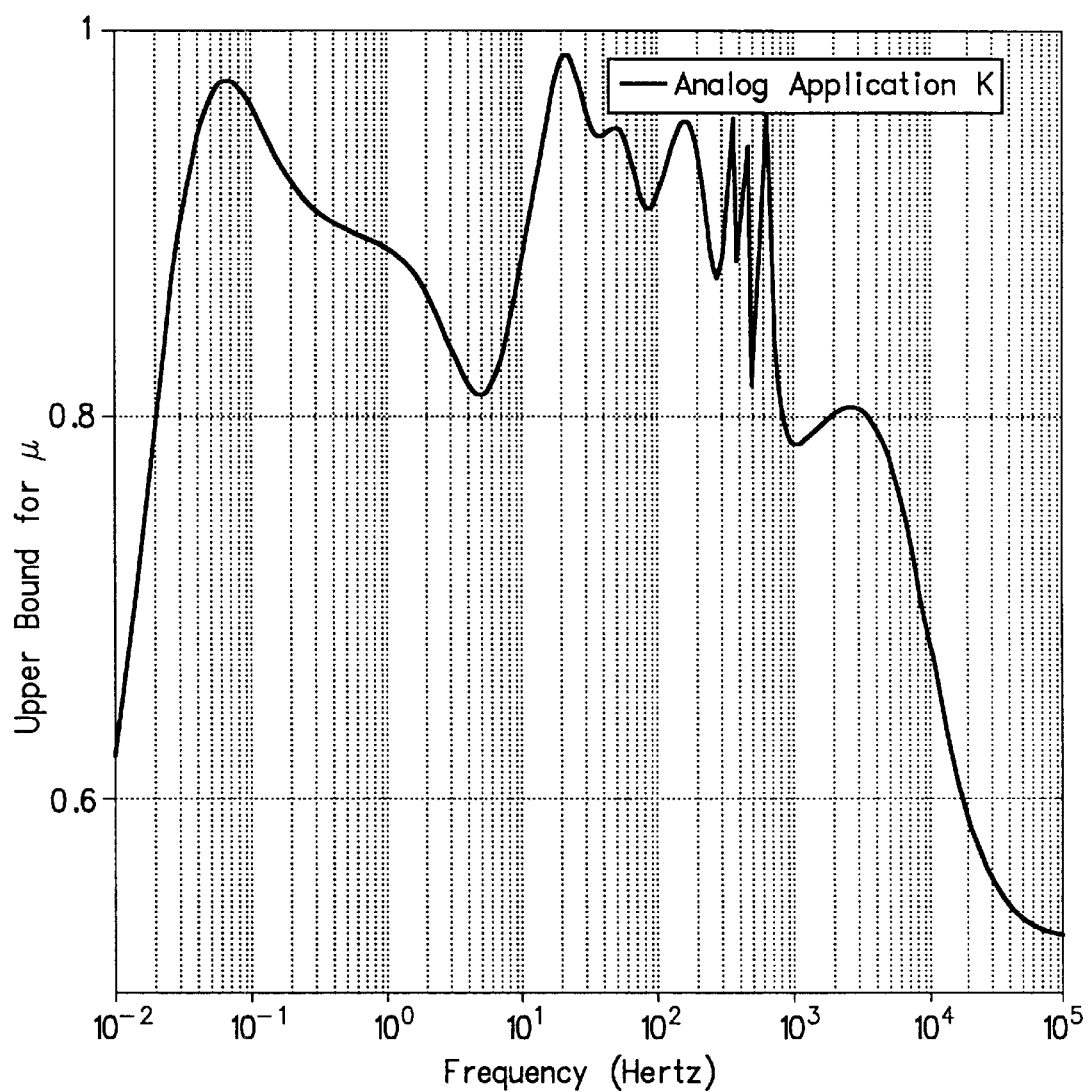
FIG. 16 illustrates $\mu$ upper-bound characteristics in accordance with the invention.

Implementing the D-K iteration scheme on the interconnection yields a stable, $35^{th}$-order controller (K), satisfying the µ-objective after two iterations. Although µ(M) can be further reduced, the third and subsequent iterations produced unstable controllers, which are undesirable since they may cause the system (with a stable plant) to become unstable in the event of sensor failure. Since the order of K is relatively high, a balanced truncation (to ninth order) was performed on K resulting in $K_{trunc}$, without dramatic change in the upper-bound for µ. Even though K could only be balance-truncated to ninth-order without violating the µ-objective, it was still too complicated for analog implementation. To further simplify $K_{trunc}$, its zeros were closely analyzed. Two low-frequency zeros were each approximated with two zeros at the origin of the complex plane and two high-frequency zeros were replaced with two zeros at ∞. To prevent the simplified controller from failing the µ-test, two of the poles belonging to $K_{trunc}$ were slightly modified using an optimization algorithm. Although the resulting controller, $K_{analog}$ still has the same order as that of $K_{trunc}$, it is considerably simpler for analog circuit design. FIG. 16 shows that the upper-bound for $\mu$ has a peak of 0.987. The transfer functions for $K_{trunc}$ and $K_{analog}$ and the simplifications are explained in detail below.

An LTI plant is represented in state-space form as:

$$\dot{x}=Ax+Bu \quad (15)$$

$$y=Cx+Du \quad (16)$$

where x is the state vector, $\dot{x}$ is the time derivative of x, u is the input vector, and y represents the output vector. For the loudspeaker system of FIG. 1, y is the pressure signal (p) from the microphone and u is the input signal to the amplifier. All signals are in Volts, with p proportional to the pressure located 1.25" away from the cone surface and u is proportional to the desired pressure response. The seventh-order linear system representing the model fit ($G_{nom}$ with dynamics in Hz) has $$\left[\begin{array}{c|c}A & B \\ \hline C & D\end{array}\right] = \left[\begin{array}{ccccccc|c} -179.39 & 0 & 0 & 0 & 0 & 0 & 0 & 238.43 \\ 0 & -38.37 & 57.56 & 0 & 0 & 0 & 0 & 76.05 \\ 0 & -57.56 & -38.37 & 0 & 0 & 0 & 0 & -167.80 \\ 0 & 0 & 0 & -90.69 & -536.65 & 0 & 0 & -23.36 \\ 0 & 0 & 0 & 0 & 0 & -43.41 & 394.02 & -9.01 \\ 0 & 0 & 0 & 0 & 0 & -394.02 & -43.41 & 0.54 \\ \hline -2.10 & -0.17 & -1.09 & 0.54 & 9.01 & 1.60 & 6.43 & 0.30 \end{array}\right] \quad (17)$$

The plant contains three non-minimum phase zeros, $z_1$, $z_2 \; 10.03 \pm 7.39i$ Hz, and $Z_7=910.83$ Hz, where the zeros are ordered in increasing frequency. The knowledge of these right-half plane zeros was necessary in assessing the control system's performance potential.

An LTI controller can be represented in state-space form as:

$$\dot{x}=Ax+By \quad (18)$$

$$u=Cx+Dy \quad (19)$$

where x is the state vector, y is the input vector, and u represents the output vector. For the previously described control system, $$y = \begin{bmatrix} d_{ref} \\ p \end{bmatrix}$$

and u is the control signal to the amplifier. The ninth-order transfer function for $K_{trunc}$ has the zeros, $z_1 = -7.028 \times 10^{-6}$ Hz, $z_2 = -4.405$, $z_3 = -31.333$, $z_4 = -33.350 - 46.315i$, $z_5 = -33.350 + 46.315i$, (20)

$z_6 = -49.431 - 468.31i$, $z_8 = 6735.9$, and $z_9 = -22233$, the poles, $p_1 = -6.029 \times 10^{-3}$ Hz, $p_2 = -2.202 - 0.421i$, $p_3 = -2.202 + 0.421i$, $p_4 = -18.602 - 25.286i$, $p_5 = -18.602 + 25.286i$, (21)

$p_6 = -78.728 - 385.07i$, $p_7 = -78.728 + 385.07i$, $p_8 = -1291.4 - 1105.6i$, and $p_9 = -1291.4 + 1106.6i$.

Simplifying $K_{trunc}$, its low-frequency zeros, $z=-7.028 \times 10^{-6}$ Hz and $z=-4.405$ Hz were each replaced with $z=0$ (i.e. $(s+7.028 \times 10^{-6})(s+4.405) \approx s^2$). Furthermore, the high-frequency zeros $z=6.74 \times 10^3$ Hz and $z=-22233$ Hz were replaced with zeros at $\infty$ (i.e. $(s-6735.9)(s+22233) \approx (-6735.9)(22233)$). The poles of $K_{trunc}$ were slightly modified where $p=-6.03 \times 10^{-3}$ Hz and $p=-2.2 \pm 0.42$ Hz were replaced with $p=-0.01$ Hz, $p=-0.4$ Hz, and $p=-0.5$ Hz, respectively. The final controller ready for implementation (C in FIG. 3 with dynamics in Hz) has $$\left[\begin{array}{c|c}A & B \\ \hline C & D\end{array}\right] = \left[\begin{array}{ccccccccc|cc} -0.01 & 0 & 0 & 0 & 0 & 0 & 0 & 0 & 0 & 0.22 & -13.2 \\ 0 & -0.40 & 0 & 0 & 0 & 0 & 0 & 0 & 0 & -59.1 & 34.8 \\ 0 & 0 & -0.50 & 0 & 0 & 0 & 0 & 0 & 0 & -65.9 & 38.8 \\ 0 & 0 & 0 & -18.6 & 25.3 & 0 & 0 & 0 & 0 & 2.68 & -1.58 \\ 0 & 0 & 0 & -25.3 & -18.6 & 0 & 0 & 0 & 0 & -8.71 & 5.13 \\ 0 & 0 & 0 & 0 & 0 & -78.7 & 385.1 & 0 & 0 & 6.69 & -3.94 \\ 0 & 0 & 0 & 0 & 0 & -385.1 & -78.7 & 0 & 0 & -10.2 & 6.01 \\ 0 & 0 & 0 & 0 & 0 & 0 & 0 & -1291 & 1107 & -13.8 & 8.14 \\ 0 & 0 & 0 & 0 & 0 & 0 & 0 & -1107 & -1291 & -48.1 & 28.3 \\ \hline -0.22 & -6.62 & 7.28 & 6.45 & -2.77 & 10.7 & -2.35 & 32.3 & -8.45 & 0 & 0 \end{array}\right] \quad (22)$$

As previously discussed, the blocks in FIG. 3 are filters. That is, block 70 (LEQ) is a low frequency equalizer, block 72 ($MP_{21}$) is a multi-pass filter, block 74 ($HP_2$) is a high-pass filter, block 76 ($MP_{22}$) is a multi-pass filter, and block 78 ($LP_2$) is a low-pass filter. The blocks have the following transfer functions:

$$LEQ = \frac{-s - z_3}{s + p_2}, \quad (23)$$

$$MP_{21} = \frac{s^2}{s^2 + \frac{w_{p45}}{Q_{p45}} + w_{p45}^2} + \quad (24)$$

$$\frac{w_{z45}}{Q_{45}w_{p45}} \frac{s}{s^2 + \frac{w_{p45}}{Q_{p45}} + w_{p45}^2} + \frac{w_{z45}^2}{w_{p45}^2} \frac{1}{s^2 + \frac{w_{p45}}{Q_{p45}} + w_{p45}^2},$$

$$HP_2 = \frac{s^2}{s^2 + \frac{w_{p13}}{Q_{p13}} + w_{p13}^2} \quad (25)$$

$$MP_{22} = c \left( \frac{s^2}{s^2 + \frac{w_{p67}}{Q_{p67}} + w_{p67}^2} + \right. \quad (26)$$

$$\left. \frac{w_{z67}}{Q_{67}w_{p67}} \frac{s}{s^2 + \frac{w_{p67}}{Q_{p67}} + w_{p67}^2} + \frac{w_{z67}^2}{w_{p67}^2} \frac{1}{s^2 + \frac{w_{p67}}{Q_{p67}} + w_{p67}^2} \right),$$

$$LP_2 = \frac{-w_{p89}^2}{s^2 + \frac{w_{p89}}{Q_{p89}} + w_{p89}^2}, \quad (27)$$

where c is a constant such that the DC-gain of $K_{analog}$ is the same as that of K, and $w_{zij}$ refers to the frequency of the zero pair, ($z_i$, $z_j$) for the analog controller (similarly with the poles). It should be noted that $HP_2$ implements $z_1$ and $z_2$ which are not written since they are located at the origin of the complex plane. Furthermore, the $MP_{ij}$ circuit topology requires the transfer function to be broken up into different sections then added up as shown in equations 24 and 26. FIG. 4 shows the circuit schematic for the filters with the specified transfer functions. The transfer functions may also be used to write code for the digital filter 100 of FIG. 5.

The simple controller, C, was fabricated as an affordable analog circuit, as shown in FIG. 4. Since noise due to the controller should be minimized, high performance analog components are preferably used. State-of-the-art Operational Amplifiers (Op-Amps) made by Burr Brown have been used throughout the design. These Op-Amps have outstanding noise specifications, low-drift, high Gain Bandwidth Product (GBP) and fast slew rate. In addition, metal film resistors and polymer film capacitors were utilized due to their exceptional temperature stability, low parasitic noise, and low tolerance. Moreover, the capacitors feature low Equivalent Series Resistances (ESR). To reduce noise and voltage fluctuations due to the power supply, a high performance, ±15 Volt DC/DC converter was used. To reduce parasitic resistances and capacitances, the traces on the double-sided, 0.0625" epoxy glass board were thick and were separated by wide distances. The epoxy glass board was chosen due to its temperature stability, and warp resistance. Due to the extruded and anodized aluminum housing (grounded), the circuit was isolated from external noises which could have been transmitted into its output. Even though the controller could have been designed as a cascade of first order filters, cascading a large number of filter sections was avoided. This design would have been very sensitive to component values and tolerances which can change due to temperature variations and noise due to each Op-Amp would have been boosted in this amplifying cascade resulting in poor Signal to Noise Ratio (SNR). To properly execute the design in analog hardware, the number of cascades were minimized and the use of global feedback, Op-Amp circuit topologies was exploited. Since most analog circuits cannot implement an arbitrary filter design without wasting unused filter segments (resulting in poor SNR), $K_{analog}$ was designed as a cascade of five well known filter topologies that offered immunity against component value variations and noise.

Figure 17A:
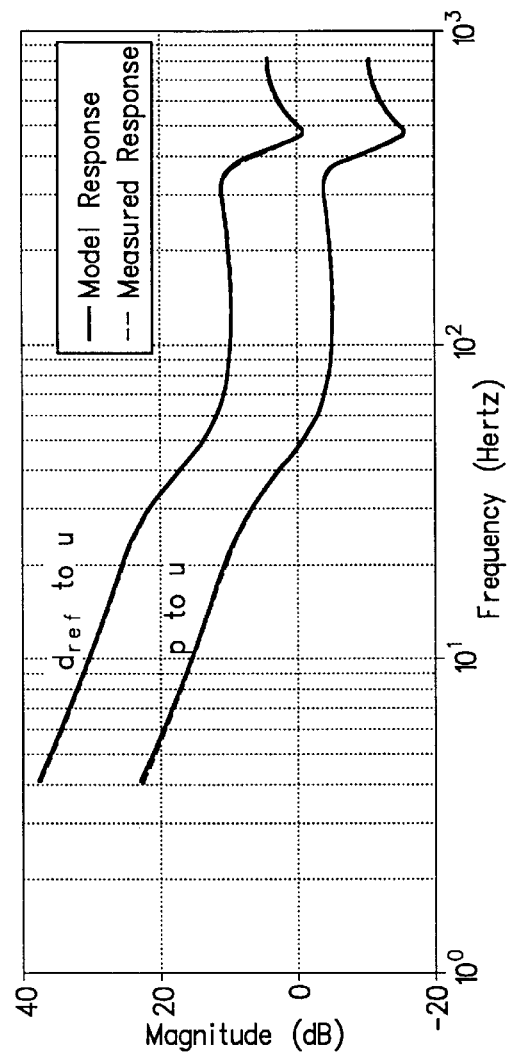
FIGS. 17(a) and 17(b) illustrate the frequency response of an analog controller constructed in accordance with an embodiment of the invention.
Figure 17B:
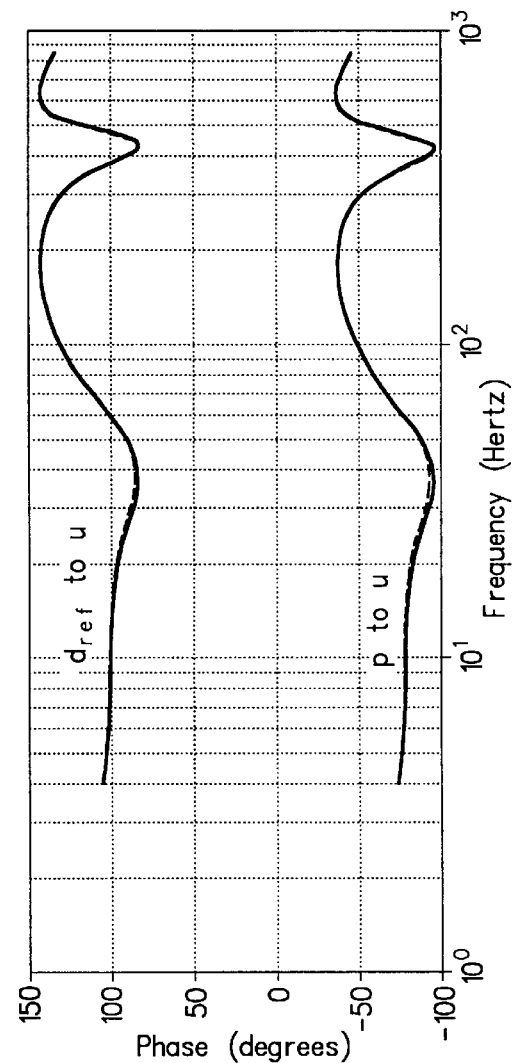
Figure 18:
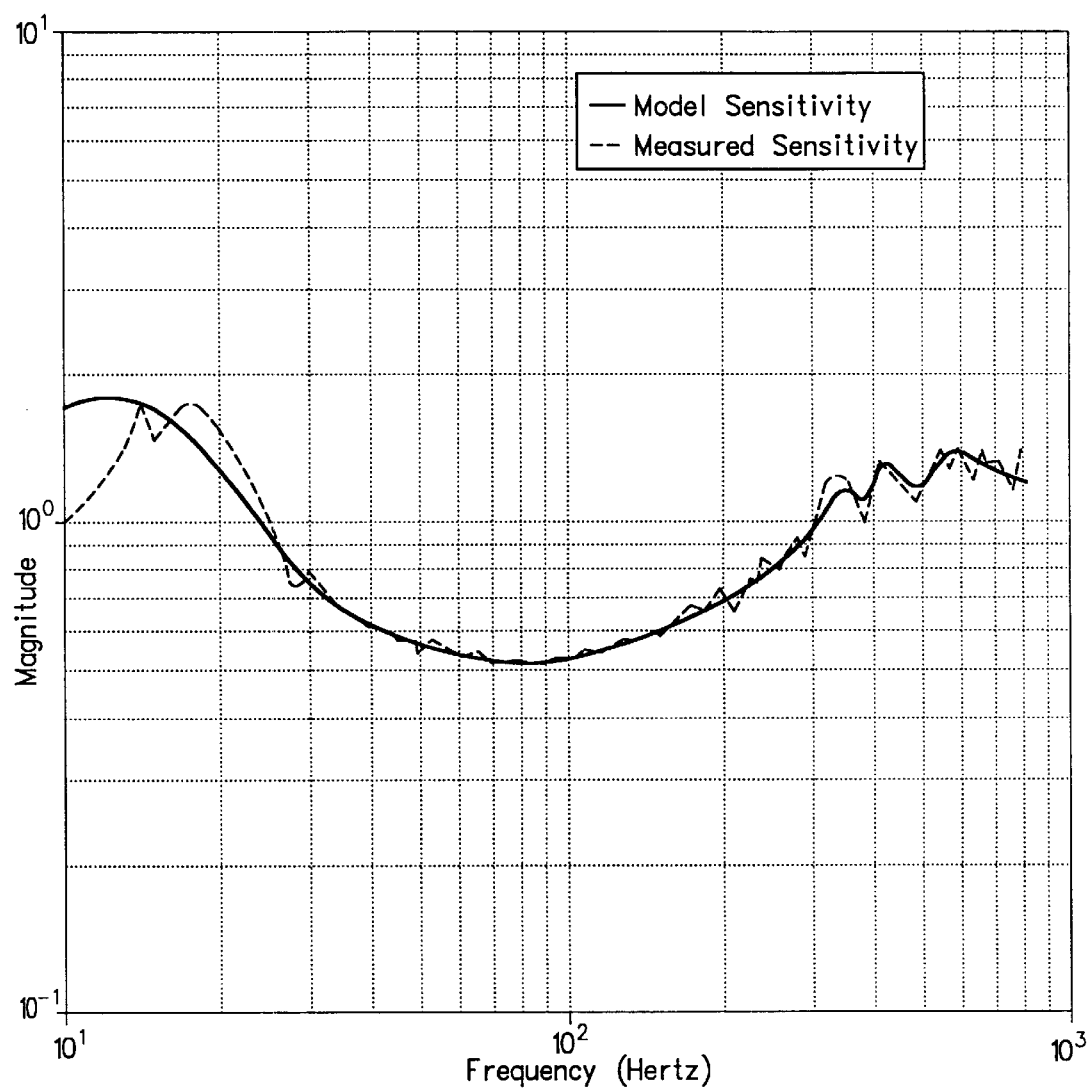
FIG. 18 illustrates a closed-loop system's sensitivity, S.
Figure 19A:
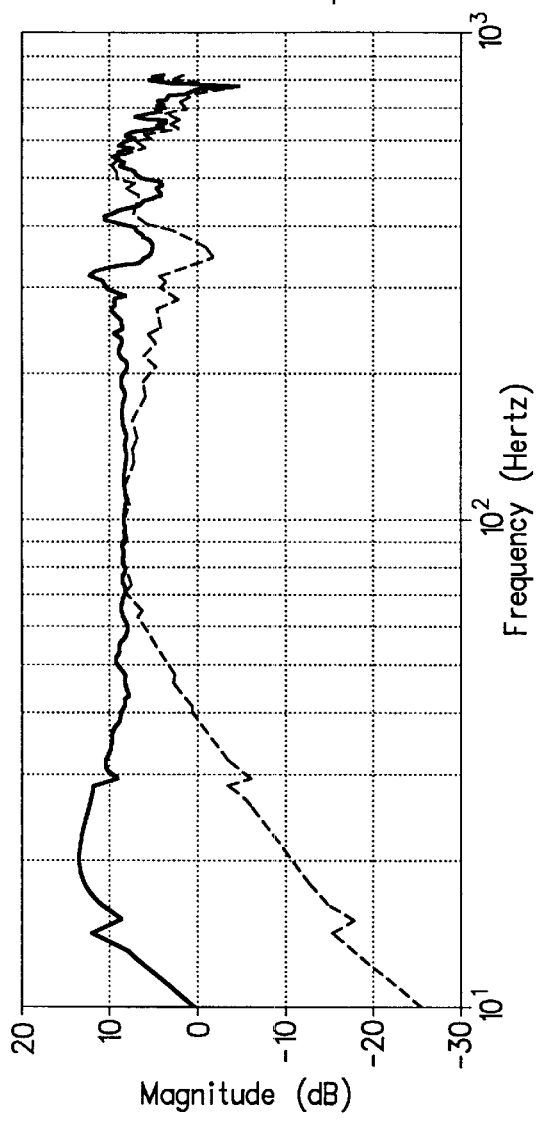
FIGS. 19(a) and 19(b) illustrate system SPL responses with and without the controller of the invention.
Figure 19B:
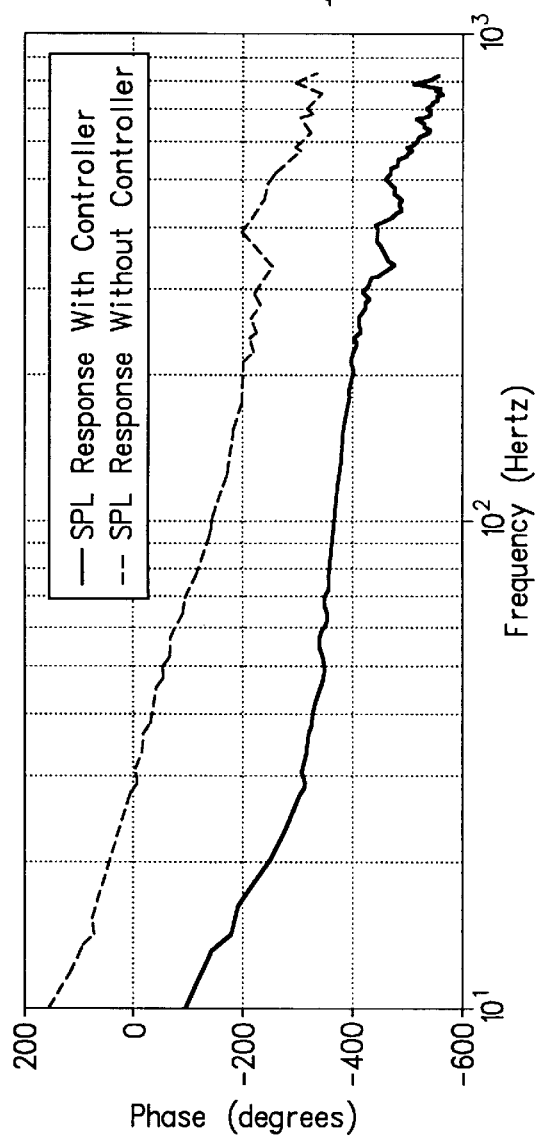
Figure 20:
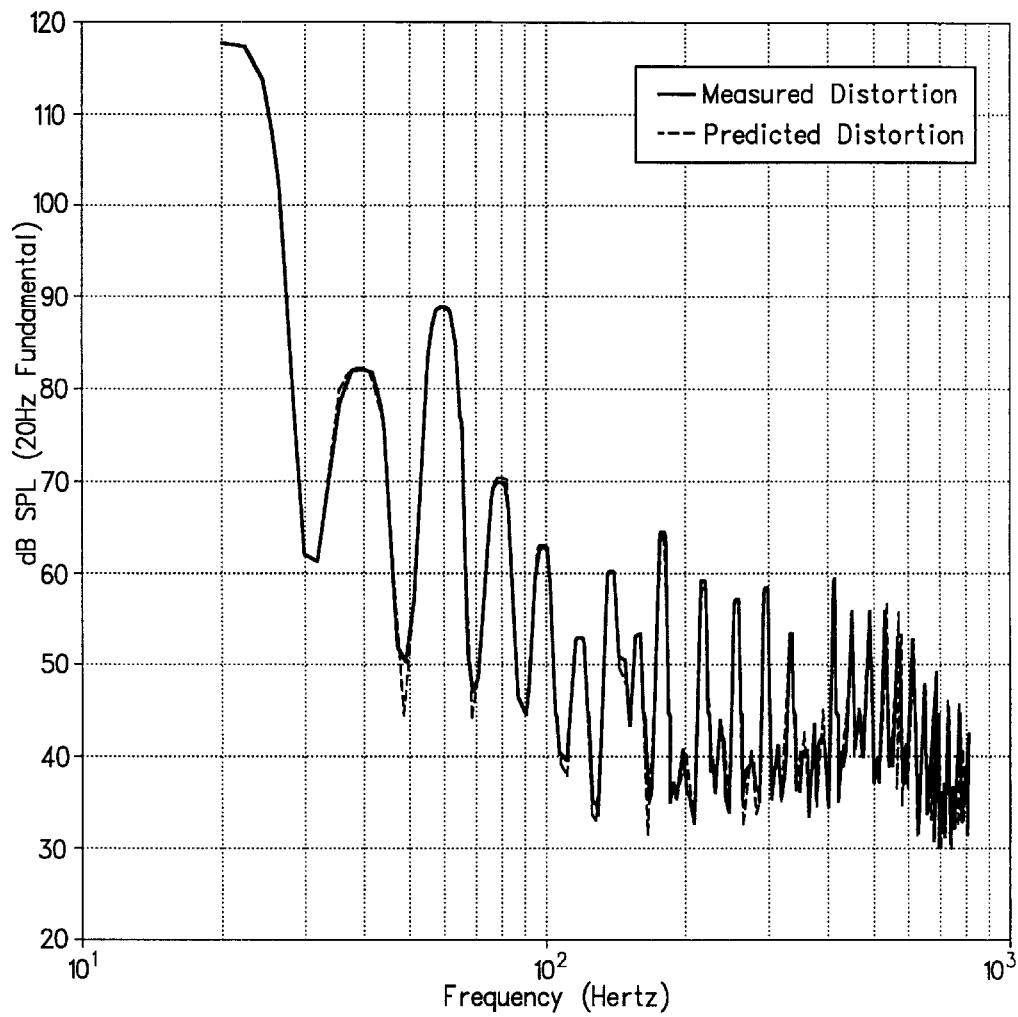
FIG. 20 illustrates the measured versus predicted harmonic distortion of a controlled system for a 20 Hz fundamental signal at 118 dB SPL.

The control designs were implemented in hardware and the predicted subwoofer performance improvements were verified. The following plots were obtained using RMS averaging and applying uniform windows to the output data due to sine-sweep inputs (except for the noise spectrum plots). In FIGS. 17(a) and 17(b), both the predicted and measured responses of C (the synthesized analog controller) were plotted. FIG. 18 shows both the measured and the model's sensitivity functions (as defined in equation 12). In FIGS. 19(a) and 19(b), the small signal SPL responses of the system with the controller in both the active and bypass modes are illustrated (β=3.24 and 1.57 for the active and bypass modes, respectively, to equalize the magnitude responses of both modes at 100 Hz). FIGS. 7(a), 7(b), 8(a), 8(b), and 9 show the measured harmonic distortions for the system with and without the controller for the fundamentals, 20 and 40 Hz, 60 and 80 Hz, and 100 Hz, respectively. Table 1 highlights relevant information about the THD and $HD_j$ from the distortion plots. To verify equation 11, the data for the harmonic distortions of the system without the controller and the measured sensitivity for the controlled system (FIG. 18) were used to predict the subwoofer system's distortion when the controller was activated for the cases with fundamental frequencies of 20, 40, 60, 80, and 100 Hz. The distortion test with a fundamental frequency of 20 Hz was used for illustration purposes. The resulting plot is presented in FIG. 20 showing the measured versus the predicted harmonic distortion. To verify that the controller circuitry did not inject significant noise into the amplifier's input, the noise spectrums for the system with the controller in both the control and the bypass modes were plotted in FIG. 21. The plot shows the RMS-averaged noise levels versus frequency (using the Hanning window) at the controller's output when both inputs were grounded.

Using a microphone and good quality analog controller emulating a μ-design to control a subwoofer in an enclosure in the low-frequency, sub-bass region, the control objective of improving the SPL response was achieved. FIGS. 17(a) and 17(b) show that the measured response of C agreed well with the prediction in a wide range of frequencies. The same is true for FIG. 18 where the measured and predicted sensitivities almost overlap between 20 an 200 Hz. Therefore, the results of the implementation agree well with the simulations and objectives for μ-design have been achieved in the implemented system. With the sensitivity function's magnitude of less than unity from 22 Hz to 326 Hz while reaching a minimum of 0.51 at 70 Hz, the closed-loop system offered significant distortion reduction in that range, as seen in equation 11. In FIGS. 19(a) and 19(b), the SPL response for the controlled case deviated by no more than 5.3 dB in magnitude and 119°, respectively (from 20 Hz to 100 Hz). It should be noted that the changes in magnitude and phase determine the SPL performance of a particular loudspeaker, not the absolute values. Deviations of less than ±3 dB in magnitude across frequencies show sufficient SPL performance for high quality sound reproduction, as was the case with the closed-loop system.

Harmonic distortion tests were conducted to assess the reduction in nonlinear distortion. FIGS. 7(a), 7(b), 8(a), 8(b), and 9 and Table 1 show large reductions in harmonic distortion for the controlled case when the subwoofer was driven with large signals, even though the uncontrolled subwoofer already exhibited good linearity at high levels. The distortion reduction was most significant when the subwoofer was driven at lower frequencies, as illustrated in FIGS. 7(a) and 7(b) in which the THD was reduced by a factor of 0.55. When driven at 100 Hz, the reductions were minimal (a factor of 0.87), which confirms the fact that the controller was designed to increase performance at low frequencies. Table 1 shows that the controlled subwoofer complied with the just-audible distortion guidelines except for the cases with the 20 and 100 Hz fundamental frequencies where the third harmonics were 3.53% and 1.32%, respectively. However, the value of the third harmonic for the 100 Hz fundamental barely exceeded the just-audible limit of 1%. Therefore, the harmonic distortion for the controlled case was largely inaudible, eliminating the need for further improvement. The THD values were less than 3.93% throughout the whole sub-bass region, which proves the superior linearity of closed-loop system. This is in contrast with the uncontrolled case, where the THD values were as large as 7.03% and the distortion was audible when the loudspeaker was driven at frequencies between 20 and 60 Hz and at 100 Hz. From Table 1, it is clear that the control system offered no significant improvement for the case with a 100 Hz fundamental frequency. Using the data for the harmonic distortions of the system without the controller and the measured sensitivity of the controlled system, the subwoofer system's distortion was predicted with the controller in the active mode for the cases with fundamental frequencies of 20, 40, 60, 80, and 100 Hz. FIG. 20 illustrates the distortion test with a fundamental frequency of 20 Hz. Both the measured data and the predicted output agreed well, which verifies equation 11. This was true for the other cases, as well.

Figure 21:
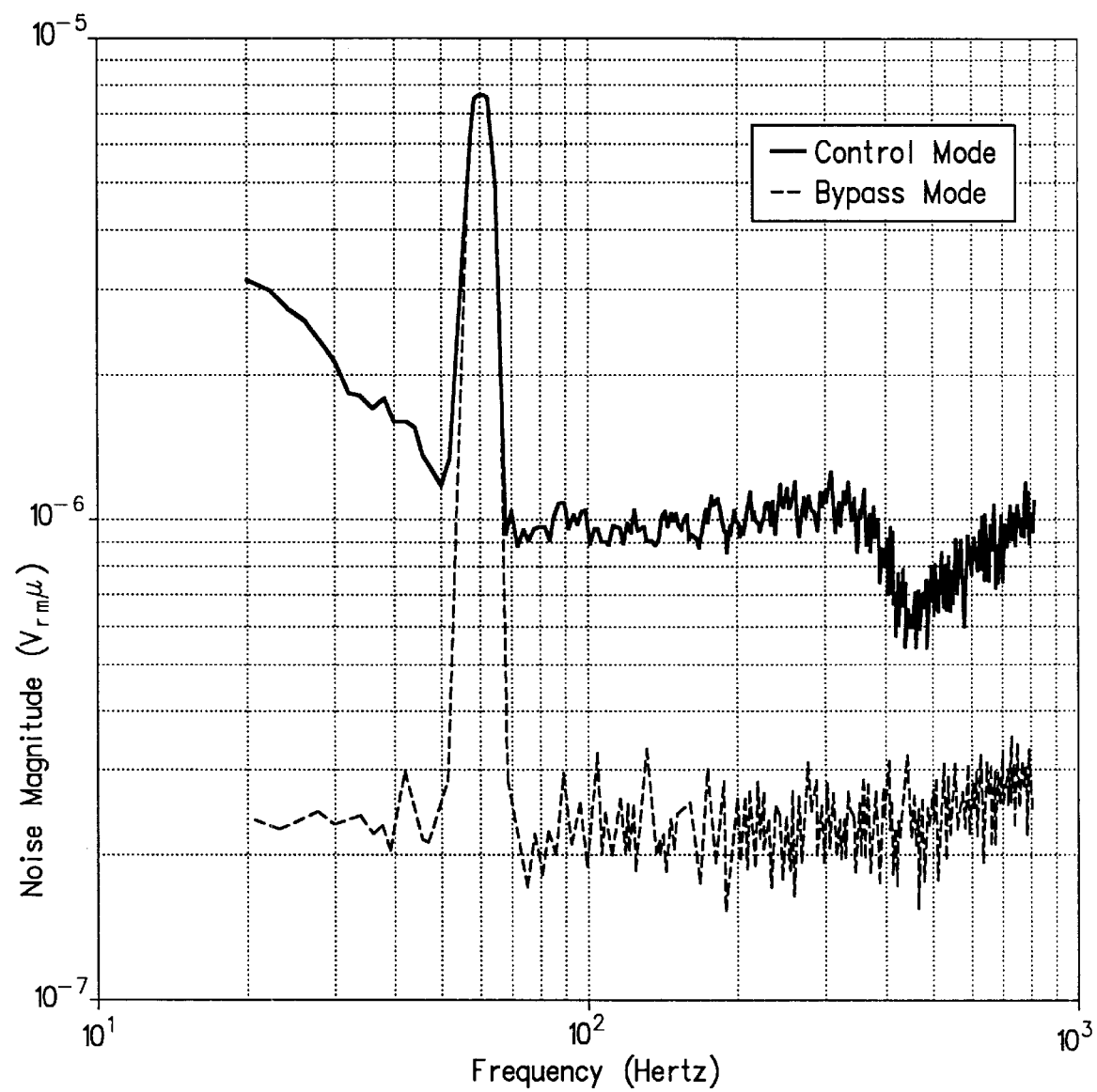
FIG. 21 illustrates a noise spectrum for an analog controller constructed in accordance with an embodiment of the invention.

Since the human ear is a very sensitive, broadband receiver with a wide dynamic range, the output noise performance of any high-performance audio system is important. When the aim is to improve the acoustic performance of a transducer, a loudspeaker controller is useless if it contributes significantly audible noise at the output. Therefore, the liberal use of top quality electronic components and good design of the controller circuit's topology provide excellent SNR. To verify this, a noise analysis was performed on the controller in both the bypass and control modes. FIG. 21 shows that even though the controller in the control mode had a higher broadband noise (from 20 to 820 Hz) than in the bypass mode, the broadband SNR was still better than 113 dB (for an output of 5 Volts RMS, the largest signal the controller can produce without clipping) which is considered excellent as compared with other existing audiophile-grade equipment. The peak of $7.6 \times 10^{-6}$ Volts RMS at 60 Hz corresponded to the 120 VAC power line noise transmitted through the shielded circuitry. As a result, the worst case SNR of 116 dB occurred at this frequency, which is also considered excellent.

Listening tests using the A/B double blindfold methodology were performed in the laboratory. These tests consisted of played-back music and test tones at various levels. The results confirmed the improvements in the SPL performance and the inaudibility of the distortion at all frequencies except for the third harmonic of the 20 Hz fundamental tone test where the distortion was markedly reduced but still slightly audible.

In sum, the cutting-edge in high fidelity loudspeaker systems is redefined using novel techniques in the analysis and control of a state-of-the-art subwoofer operating in the frequency region between 20 Hz and 100 Hz. The control objective of improving the SPL response was achieved by flattening its frequency response and minimizing the harmonic distortion. This was made possible by the use of a microphone and an analog controller of good quality emulating a $\mu$-analysis and synthesis design. As shown in FIGS. 19(a) and 19(b), the maximum deviations in the sub-bass SPL response were no greater than 5.3 dB in magnitude and 119° in phase, as compared with the standalone (uncontrolled) loudspeaker which had magnitude and phase response changes of 19 dB and 191°, respectively. Also, the harmonic distortion was greatly reduced over the controlled region, as shown in FIGS. 7(a), 7(b), 8(a), 8(b), and 9 and Table 1. This was especially evident at lower frequencies where the THD was reduced by a factor of 0.55. On the other hand, the THD reductions were minimal at frequencies near or greater than 100 Hz, which verifies the controller's sole purpose of improving the sub-bass performance of the loudspeaker. The THD values do not exceed 3.93%, and the distortion was largely inaudible. This was in contrast to the uncontrolled loudspeaker for which the distortion was audible throughout the whole frequency range and the THD was as large as 7.03%. In addition, FIGS. 17(a), 17(b) and 20 verify that these results agreed well with the predictions and the techniques outlined herein do produce measurable improvements. Furthermore, the excellent SNR due to the liberal use of top quality electronic components and good design of the controller circuit's topology was verified in FIG. 21. The figure shows that the broadband and peak SNR did not exceed 113 dB and 116 dB, respectively. Listening tests consisting of played-back music and test tones using the A/B double blindfold methodology further verified the significant performance improvements.

The closed-loop system measurably outperformed the stand-alone loudspeaker. This shows that the control paradigm was well suited for this application producing a loudspeaker system with attributes that redefine the performance envelope of high-end subwoofers and aid in attaining the ultimate goal of most loudspeaker systems: accurate sound reproduction.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A sound producing system, comprising:
   a loudspeaker to generate an audible signal;
   a transducer to generate a pressure feedback signal from said audible signal; and
   a controller to produce a controlled signal for application to said loudspeaker, said controller deriving said controlled signal from said pressure feedback signal and an audio input signal, said controlled signal improving the Sound Pressure Level (SPL) frequency response of said loudspeaker and reducing distortion of said audible signal by said loudspeaker within a predefined sub-bass frequency range, said controller comprising:
      a summing junction circuit to generate a filter input signal from said pressure feedback signal and said audio input signal; and
      a plurality of filters to generate said controlled signal from said filter input signal, wherein said filters reduce distortion in a predefined sub-bass frequency range, the reduced distortion comprising distortion associated with a non-uniform magnetic field of a component of the loudspeaker, a dependence of self-inductance of said loudspeaker component on cone position, and nonlinear stiffness associated with a cone of the loudspeaker;
   wherein said controller is configured so that said system has an associated closed loop sensitivity function S whose value is less than 1.0 in at least a substantial portion of the sub-bass frequency range.

2. The system of claim 1 wherein said transducer is a microphone.

3. The system of claim 1 wherein said sub-bass frequency range includes 20 Hz to 100 Hz.

4. The system of claim 1 wherein said controller produces a controlled signal that improves the SPL frequency response and reduces distortion in said loudspeaker in the presence of loudspeaker disturbances.

5. The system of claim 1 wherein said controller produces a controlled signal that improves the SPL frequency response and reduces distortion in said loudspeaker in the presence of loudspeaker disturbances selected from the group consisting of modeling errors, temperature changes, humidity, aging, and acoustic field changes.

6. The system of claim 1 wherein said controller includes an analog filter circuit.

7. The system of claim 1 wherein said controller includes a digital filter.

8. A sound producing system, comprising:
   a loudspeaker to generate an audible signal;
   a transducer to generate a pressure feedback signal from said audible signal; and
   a controller to produce a controlled signal for application to said loudspeaker, said controller deriving said controlled signal from said pressure feedback signal and an audio input signal, said controlled signal improving the Sound Pressure Level (SPL) frequency response of said loudspeaker and reducing distortion of said audible signal by said loudspeaker within a predefined sub-bass frequency range, said controller comprising:
      a summing junction circuit to generate a filter input signal from said pressure feedback signal and said audio input signal; and
      a plurality of filters to generate said controlled signal from said filter input signal, wherein said filters reduce distortion in a predefined sub-bass frequency range, the reduced distortion comprising distortion associated with a non-uniform magnetic field of a component of the loudspeaker, a dependence of self-inductance of said loudspeaker component on cone position, and nonlinear stiffness associated with a cone of the loudspeaker;
   wherein said controller is configured so that said system has an associated closed loop sensitivity function S whose value is less than 1.0 in at least the 25 Hz to 250 Hz frequency range.

9. The system of claim 8 wherein said transducer is a microphone.

10. The system of claim 8 wherein said controller produces a controlled signal that improves the SPL frequency response and reduces distortion in said loudspeaker in the presence of loudspeaker disturbances.

11. The system of claim 8 wherein said controller produces a controlled signal that improves the SPL frequency response and reduces distortion in said loudspeaker in the presence of loudspeaker disturbances selected from the group consisting of modeling errors, temperature changes, humidity, aging, and acoustic field changes.

12. A sound producing system, comprising:
   a loudspeaker to generate an audible signal;
   a transducer to generate a pressure feedback signal from said audible signal; and
   a controller to produce a controlled signal for application to said loudspeaker, said controller deriving said controlled signal from said pressure feedback signal and an audio input signal, said controlled signal improving the Sound Pressure Level (SPL) frequency response of said loudspeaker and reducing distortion of said audible signal by said loudspeaker within a predefined sub-bass frequency range, said controller comprising:
      a summing junction circuit to generate a filter input signal from said pressure feedback signal and said audio input signal; and
      a plurality of filters to generate said controlled signal from said filter input signal, wherein said filters reduce distortion in a predefined sub-bass frequency range, the reduced distortion comprising distortion associated with a non-uniform magnetic field of a component of the loudspeaker, a dependence of self-inductance of said loudspeaker component on cone position, and nonlinear stiffness associated with a cone of the loudspeaker;
   wherein said controller is configured so that said audible signal generated by said loudspeaker has an associated total harmonic distortion of 3.93% or less for all frequencies in the predefined sub-bass frequency range for sound levels of 120 to 140 db re 20 $\mu$Pa at said transducer.

13. The system of claim 12 wherein said transducer is a microphone.

14. The system of claim 12 wherein said sub-bass frequency range includes 20 Hz to 100 Hz.

15. The system of claim 12 wherein said controller produces a controlled signal that improves the SPL frequency response and reduces distortion in said loudspeaker in the presence of loudspeaker disturbances.

16. The system of claim 12 wherein said controller produces a controlled signal that improves the SPL frequency response and reduces distortion in said loudspeaker in the presence of loudspeaker disturbances selected from the group consisting of modeling errors, temperature changes, humidity, aging, and acoustic field changes.

17. A sound producing system, comprising:
   a loudspeaker to generate an audible signal;
   a single transducer to generate a single pressure feedback signal from said audible signal; and a controller to produce a controlled signal for application to said loudspeaker, said controller deriving said controlled signal solely from said single pressure feedback signal and an audio input signal, said controlled signal improving the Sound Pressure Level (SPL) frequency response and reducing distortion within a selected bandwidth of said loudspeaker, said controller comprising:

a summing junction circuit to generate a filter input signal from said pressure feedback signal and said audio input signal; and a plurality of filters to generate said controlled signal from said filter input signal, wherein said filters reduce distortion in said audible signal within a predefined sub-bass frequency range;

wherein the controller is configured so that said system has an associated closed loop sensitivity function S whose value is less than 1.0 in at least a substantial portion of the sub-bass frequency range.

18. The system of claim 17 wherein said transducer is a microphone.

19. The system of claim 17 wherein said sub-bass frequency range includes 20 Hz to 100 Hz.

20. The system of claim 17 wherein said controller produces a controlled signal that improves the SPL frequency response and reduces distortion in said loudspeaker in the presence of loudspeaker disturbances.

21. The system of claim 17 wherein said controller produces a controlled signal that improves the SPL frequency response and reduces distortion in said loudspeaker in the presence of loudspeaker disturbances selected from the group consisting of modeling errors, temperature changes, humidity, aging, and acoustic field changes.

22. A sound producing system, comprising:

a loudspeaker to generate an audible signal;

a single transducer to generate a single pressure feedback signal from said audible signal; and a controller to produce a controlled signal for application to said loudspeaker, said controller deriving said controlled signal solely from said single pressure feedback signal and an audio input signal, said controlled signal improving the Sound Pressure Level (SPL) frequency response and reducing distortion within a selected bandwidth of said loudspeaker, said controller comprising:

a summing junction circuit to generate a filter input signal from said pressure feedback signal and said audio input signal; and a plurality of filters to generate said controlled signal from said filter input signal, wherein said filters reduce distortion in said audible signal within a predefined sub-bass frequency range;

wherein the controller is configured so that said system has an associated closed loop sensitivity function S whose value is less than 1.0 in at least the 25 Hz to 250 Hz frequency range.

23. The system of claim 22 wherein said transducer is a microphone.

24. The system of claim 22 wherein said controller produces a controlled signal that improves the SPL frequency response and reduces distortion in said loudspeaker in the presence of loudspeaker disturbances.

25. The system of claim 22 wherein said controller produces a controlled signal that improves the SPL frequency response and reduces distortion in said loudspeaker in the presence of loudspeaker disturbances selected from the group consisting of modeling errors, temperature changes, humidity, aging, and acoustic field changes.

26. A sound producing system, comprising:

a loudspeaker to generate an audible signal;

a single transducer to generate a single pressure feedback signal from said audible signal; and a controller to produce a controlled signal for application to said loudspeaker, said controller deriving said controlled signal solely from said single pressure feedback signal and an audio input signal, said controlled signal improving the Sound Pressure Level (SPL) frequency response and reducing distortion within a selected bandwidth of said loudspeaker, said controller comprising:

a summing junction circuit to generate a filter input signal from said pressure feedback signal and said audio input signal; and a plurality of filters to generate said controlled signal from said filter input signal, wherein said filters reduce distortion in said audible signal within a predefined sub-bass frequency range;

wherein the controller is configured so that the audible signal generate by said loudspeaker has an associated total harmonic distortion of 3.93% or less for all frequencies in the predefined sub-bass frequency range for sound levels of 120 to 140 db re 20 $\mu$Pa at said transducer.

27. The system of claim 26 wherein said transducer is a microphone.

28. The system of claim 26 wherein said sub-bass frequency range includes 20 Hz to 100 Hz.

29. The system of claim 26 wherein said controller produces a controlled signal that improves the SPL frequency response and reduces distortion in said loudspeaker in the presence of loudspeaker disturbances.

30. The system of claim 26 wherein said controller produces a controlled signal that improves the SPL frequency response and reduces distortion in said loudspeaker in the presence of loudspeaker disturbances selected from the group consisting of modeling errors, temperature changes, humidity, aging, and acoustic field changes.

* * * * *